United States Patent
Gupta et al.

(10) Patent No.: US 12,159,664 B2
(45) Date of Patent: Dec. 3, 2024

(54) CONCURRENT MEMORY ACCESS OPERATIONS

(71) Applicant: Arm Limited, Cambridge (GB)

(72) Inventors: Lalit Gupta, Cupertino, CA (US); Bo Zheng, Cupertino, CA (US); Fakhruddin Ali Bohra, San Jose, CA (US); Nimish Sharma, Jalandhar (IN); Nicolaas Klarinus Johannes Van Winkelhoff, Roquefort-les-pins (FR); El Mehdi Boujamaa, Valbonne (FR)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/709,665

(22) Filed: Dec. 10, 2019

(65) Prior Publication Data
US 2021/0110867 A1    Apr. 15, 2021

(30) Foreign Application Priority Data

Oct. 14, 2019    (IN) .............................. 201941041456

(51) Int. Cl.
*G11C 11/419*    (2006.01)
*G11C 11/16*    (2006.01)

(52) U.S. Cl.
CPC ........ *G11C 11/419* (2013.01); *G11C 11/1673* (2013.01); *G11C 11/1675* (2013.01)

(58) Field of Classification Search
CPC .............. G11C 11/419; G11C 11/1675; G11C 11/1673
See application file for complete search history.

(56) References Cited

U.S. PATENT DOCUMENTS

| 6,181,634 | B1 * | 1/2001 | Okita | G11C 8/16 |
| | | | | 365/194 |
| 8,913,420 | B2 * | 12/2014 | Yanni | G06F 13/16 |
| | | | | 365/154 |
| 9,520,165 | B1 * | 12/2016 | Desai | G11C 7/12 |
| 2014/0003160 | A1 * | 1/2014 | Trivedi | G11C 7/065 |
| | | | | 365/189.02 |
| 2014/0056093 | A1 * | 2/2014 | Tran | G11C 11/419 |
| | | | | 365/230.03 |
| 2014/0104960 | A1 * | 4/2014 | Iyer | G11C 7/1042 |
| | | | | 365/189.05 |

(Continued)

FOREIGN PATENT DOCUMENTS

| TW | I263219 B | 10/2006 |
| TW | I494920 B | 8/2015 |

OTHER PUBLICATIONS

TIPO Office Action; TW 109135102; Jun. 13, 2024.

*Primary Examiner* — Sung Il Cho
(74) *Attorney, Agent, or Firm* — Pramudji Law Group PLLC; Ari Pramudji

(57) ABSTRACT

Various implementations described herein refer to a method for providing memory with one or more banks. The method may include coupling read-write column multiplexer circuitry to the memory via bitlines including coupling a write column multiplexer to the bitlines for write operations and coupling a read column multiplexer to the bitlines for read operations. The method may include performing concurrent read operations and write operations in the one or more banks of the memory with the write column multiplexer and the read column multiplexer via the bitlines.

22 Claims, 22 Drawing Sheets

(56) References Cited

U.S. PATENT DOCUMENTS

| | | | |
|---|---|---|---|
| 2014/0340978 A1* | 11/2014 | Tran | G11C 11/413 365/230.03 |
| 2015/0109865 A1* | 4/2015 | Gulati | G11C 7/12 365/189.02 |
| 2015/0143020 A1* | 5/2015 | Ferreira | G11C 11/1659 365/158 |
| 2016/0027504 A1 | 1/2016 | Lee | |
| 2019/0130965 A1* | 5/2019 | Siddiqui | G11C 11/419 |
| 2020/0020390 A1* | 1/2020 | Fujiwara | G11C 11/1655 |
| 2020/0202924 A1* | 6/2020 | Intrater | G11C 29/021 |
| 2020/0327932 A1* | 10/2020 | Verma | G11C 11/419 |

* cited by examiner

CONCURRENT MEMORY ACCESS OPERATIONS

CROSS-REFERENCE TO RELATED APPLICATIONS

This application claims the benefit of and priority to Indian patent application number 201941041456, filed 2019 Oct. 14 and titled COLUMN MULTIPLEXING TECHNIQUES, the disclosure of which is incorporated herein in its entirety.

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Memory compilers utilize configuration data to generate physical layout designs of memory circuitry for column multiplexing operations. Traditional memory compilers examine characterized data to develop various memory instances that cover the memory compiler space. However, some traditional techniques typically introduce accuracy errors in reference to memory instance data. In some cases, various leakage, timing, power and noise data for the memory instances are stored, and some traditional memory compilers typically analyze error prone memory instances related to entire memory circuits, gather results and then compute a final result. However, traditional techniques are costly, time consuming and inefficient, and traditional techniques may cause accuracy errors because some memory instances are sensitive to a number of rows (e.g., bitcells, columns, and/or wordline drivers). Also, in some cases, only a single wordline in one bank is accessible in some bank architectures, wherein users perform either a read operation or a write operation. Thus, there exists a need to improve physical design implementation of some memory circuits to provide for more efficient column multiplexing operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to column multiplexing schemes and techniques that improve memory access operations in various physical memory layout designs. For instance, various schemes and techniques described herein may provide for a system or device having a unique single port memory architecture that supports dual wordline circuitry, such as, e.g., dual y-mux architecture for various physical memory layout designs. In some instances, various schemes and techniques described herein may provide for a system or device having a memory architecture that is configured to avoid data-to-bitline coupling in various physical memory layout designs. Also, in other instances, the various schemes and techniques described herein may be configured to perform concurrent memory access operations, such as, e.g., performing concurrent read operations and write operations in a single bank or multiple bans using a single column or multiple different columns.

Various implementations of column multiplexing schemes and techniques will be described in detail herein with reference to FIGS. 1-12.

Figure 1:
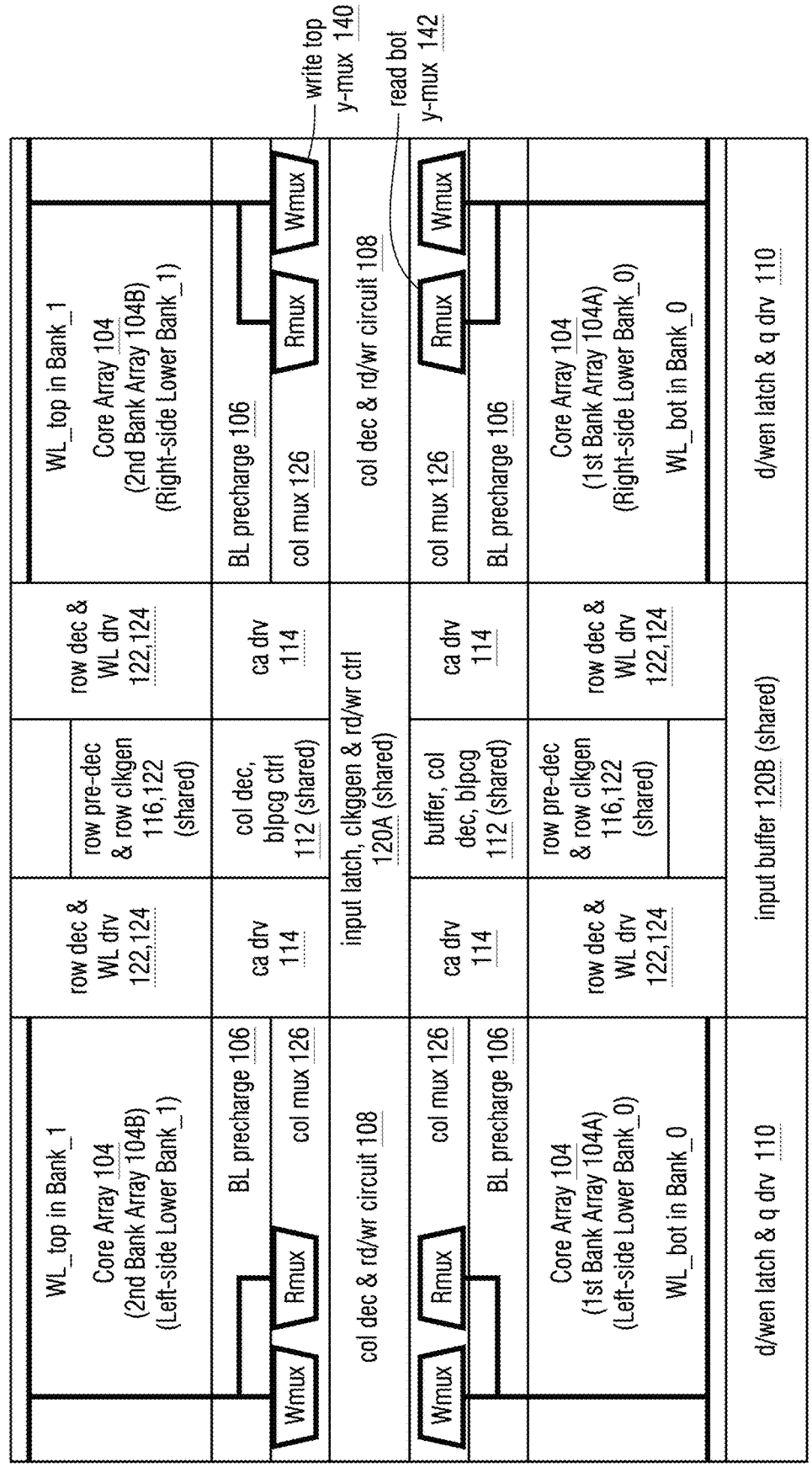
FIG. 1 illustrates a diagram of memory circuitry in accordance with various implementations described herein.

FIG. 1 illustrates a diagram of memory circuitry 100 for column multiplexing in accordance with various implementations described herein. In various instances, the memory circuitry 100 may refer to a device having single port memory architecture with multiple wordlines and logic circuitry fabricated with various physical cell layout schemes and techniques as described herein. Also, the single port memory architecture may be fabricated with the column multiplexing schemes and techniques described herein for the physical cell layout of the memory architecture.

The memory circuitry 100 shown in FIG. 1 may include multiple memory core arrays 104, such as, e.g., a quad core array. However, in various other instances, a single core array and/or a dual core array may be used in some embodiments. Thus, as shown in FIG. 1, the memory instance 100 may include four memory instances (e.g., multiple core arrays 104 in a quad memory core configuration), and the four memory instances may share one or more control cells, such as, e.g., row pre-dec & row clk gen 116, 122, col dec, blpcg ctrl 112, input latch, clkgen & rd/wr ctrl 120A, and input buffer 120B, which represent shared circuit components.

As shown in FIG. 1, the memory circuitry 100 may be implemented with one or more memory blocks with various categories of control cells arranged to provide various memory related components. The memory circuitry 100 may include a first category (cat-1) of control cells that are arranged to provide core array circuitry 104 along with bitline (BL) precharge circuitry 106. The memory circuitry 100 may be implemented with memory circuitry having multiple core arrays 104 in a quad bank configuration, wherein each bank has an array of memory cells or bitcells. Each bitcell may be configured to store at least one data bit value (e.g., data value related to a logical '0' or '1'). Also, the core arrays 104 include any number of bitcells arranged in various configurations, such as, e.g., a two-dimensional (2D) memory array having any number of columns and any number of rows of multiple bitcells, which may be arranged in a 2D grid pattern for column multiplexing and read-write memory access operations. Each bitcell may be implemented with any type of memory, including, e.g., static random access memory (SRAM), magneto-resistive RAM (MRAM), and/or any other type of memory. For instance, each bitcell may include a multi-transistor static RAM (SRAM) cell, including various types of SRAM cells, such as, e.g., 6T CMOS SRAM and/or any other type of complementary MOS (CMOS) SRAM cells, such as, e.g., 4T, 8T, 10T, or more transistors per bit. In other instances, each bitcell may include a multi-layer MRAM bitcell having free-layers and pinned layers.

The memory circuitry 100 may include a second category (cat-2) of control cells that are coupled to the first category (cat-1) of control cells, and the second category (cat-2) of control cells may be arranged to provide read-write circuitry 108 (i.e., rd/wr circuit) for accessing data stored in memory cells of the core array circuitry 104. The read-write circuitry 108 may include latch and output drive circuitry 110 (i.e., d/wen latch & q drv).

The memory circuitry 100 may include a third category (cat-3) of control cells that are coupled to the first category (cat-1) of control cells and the second category (cat-2) of control cells, and the third category (cat-3) of control cells are arranged to provide control circuitry 112, 114 for controlling access to the data stored in the memory cells of the core array circuitry 104 and for controlling operation of the read-write circuitry 108. The control circuitry 112, 114 may include bitline precharge control (i.e., blpcg) 112 and column driver (i.e., ca drv) and read-write control 114 (i.e., rd/wr ctrl) along with a row predecoder 116 (i.e., row pre-dec), a row driver 118 (i.e., ra drv), and a input buffer and latch along with clock generation 120 (i.e., input buffer & latch, clkgen).

The memory circuitry 100 may also include a row decoder 122 (i.e., row dec), a wordline driver 124 (i.e., WL drv), and a column multiplexer 126 (i.e., col mux), which may or may not part of the multiple categories (cat-1, cat-2, cat-3) of control cells. In some instances, the row decoder 122 (i.e., row dec) may be used to access each of the bitcells via a selected wordline (WL) that is driven by the wordline driver 124 (i.e., WL drv). Also, the combination of the row decoder 122 (i.e., row dec) and the wordline driver 124 (i.e., WL drv) may be referred to as (wdx).

The column multiplexer 126 (i.e., col mux or colmux) may be used to access each of the bitcells via one or more selected bitlines BL, . . . , BLn. In some instances, the selected bitlines BL, . . . , BLn may include a selected pair of complementary bitlines BL/NBL, . . . , BLn/NBLn. The row decoder 122 (i.e., row dec) may be coupled to the wordline driver 124 (i.e., WL drv) and the column multiplexer 126 (i.e., col mux) to select one or more bitcells in the core arrays 104 with one or more wordline (WL) signals and one or more bitline (BL) signals. Also, in some instances, the column multiplexer 126 (i.e., col mux) and/or components associated therewith (e.g., 106, 108, 110) may receive one or more data signals (D) and one or more other I/O signals (Q) that are associated with reading and writing data to the bitcells in the core arrays 104.

In some implementations, as shown in FIG. 1, the memory circuitry 100 may include single port memory architecture having multiple bitcell arrays 104 with a first bitcell array 104A (e.g., lower bank array Bank_0) and a second bitcell array (e.g., upper bank array Bank_1) that is different than the first bitcell array 104. In some instances, the upper bank array (Bank_0) may be referred to as a bottom bank array, and also, the lower bank array (Bank_1) may be referred to as a lower bank array. Also, as shown in FIG. 1, the bank arrays 104, 104A, 104B may be relatively disposed as upper/top and lower/bottom (or bot) configurations and as right-side and left-side configurations.

The memory circuitry 100 may include multiple wordlines (WL) that are coupled to the single port memory architecture including a first wordline (e.g., WL_bot in Bank_0) that is coupled to the first bitcell array 104A (e.g., lower bank array Bank_0) and a second wordline (e.g., WL_top in Bank_1) that is coupled to the second bitcell array 104B (e.g., upper bank array Bank_1). As shown in FIG. 1, the column multiplexer 126 may include a write multiplexer (i.e., Wmux) and a read multiplexer (i.e., Rmux) that are coupled to the multiple wordlines (WL). For instance, the first wordline (e.g., WL_bot in Bank_0) may be coupled to the write mux (Wmux) and the read mux (Rmux) in the lower colmux 126, and the second wordline (e.g., WL_top in Bank_1) may be coupled to the write mux (Wmux) and the read mux (Rmux) in the upper colmux 126.

In some implementations, the memory circuitry 100 may include multiple write multiplexers (e.g., write top/bot y-mux 140 in colmux 126) and multiple read multiplexers (e.g., read top/bot y-mux 142 in colmux 126). As shown in FIG. 1, the first bank arrays 104A may include lower/bottom wordlines (e.g., WL_bot in Bank_0) that are coupled to the lower write mux (e.g., Wmux: write bot y-mux 140) in colmux 126 and also coupled to the lower read mux (e.g., Rmux: read bot y-mux 142) in colmux 126. Also, the second bank arrays 104B may include upper/top wordlines (e.g., WL_top in Bank_1) that are coupled to the upper write mux (e.g., Wmux: write top y-mux 140) in colmux 126 and also coupled to the upper read mux (e.g., Rmux: read top y-mux 142) in colmux 126. Further scope and disclosure related to the write multiplexers (Wmux) and the read multiplexers (Rmux) are described in greater detail herein below in reference to FIG. 2.

The memory circuitry 100 may include logic circuitry (e.g., some combination of 106, 108, 116, 122, 124, 126) that may be configured to perform multiple memory access operations concurrently in the single port memory architecture including performing a read operation (e.g., via Rmux) in the first bitcell array 104A (lower bank array Bank_0) using the first wordline (WL_bot in Bank_0) while performing a write operation (e.g., via Wmux) in the second bitcell array 104B (upper bank array Bank_1) using the second wordline (WL_top in Bank_1), or performing a write operation (e.g., via Wmux) in the first bitcell array 104A (lower bank array Bank_0) using the first wordline (WL_bot in Bank_0) while performing a read operation (e.g., via Rmux) in the second bitcell array 104B (upper bank array Bank_1) using the second wordline (WL_top in Bank_1).

In some implementations, the same memory address may be used to perform the multiple memory access operations concurrently in the single port memory, and the same memory address may refer to the same row address in the first bitcell array 104A (lower or bottom bank array Bank_0) and the second bitcell array 104B (upper or top bank array Bank_1). In some instances, the read operation may be performed in the first bitcell array 104A with a memory address while the write operation is performed concurrently in the second bitcell array 104B with the memory address, and also, the write operation may be performed in the first bitcell array 104A with a memory address while the read operation is performed concurrently in the second bitcell array 104B with the memory address. Also, a global write enable signal (GWEN) along with a row address may be used to perform the write operation in the first bitcell array 104A or the second bitcell array 104B, and a global read enable signal (GREN) along with a row address may be used to perform the read operation in the first bitcell array 104A or the second bitcell array 104B. In some instances, the GWEN and GREN signals are gated with a decoded Y select line, wherein GREN may be gated with COLM address bit and internal gtp to generate YPR<0:N> for the READ Y-mux. Similarly, GWEN may be gated with COLM address bit and internal gtp to generate YPW<0:N> for the Write Y-mux.

In some implementations, as described herein, the memory circuitry 100 may be configured for performing concurrent memory access operations. For instance, the memory circuitry 100 may be configured for performing concurrent read operations and write operations in the one or more banks 104 with the write column multiplexers (Wmux) 140 and read column multiplexers (Rmux) 142 via dual wordlines (WL_top, WL_bot) in the one or more banks 104 and multiple bitlines (e.g., BL, NBL). In some instances, the one or more banks 104 include multiple different banks (e.g., upper/lower right/left 104A and upper/lower right/left 104B), and performing concurrent read operations and write operations in the multiple different banks may be achieved with the same column. Also, in other instances, the one or more banks 104 may include performing concurrent read operations and write operations in the multiple different banks (e.g., upper/lower right/left 104A and upper/lower right/left 104B) with different columns. Further, in other instances, performing concurrent read operations and write operations in the one or more banks 104 may be achieved in the same bank with different columns. These ideas are described in greater detail herein below in reference to FIGS. 2-12.

Figure 2:
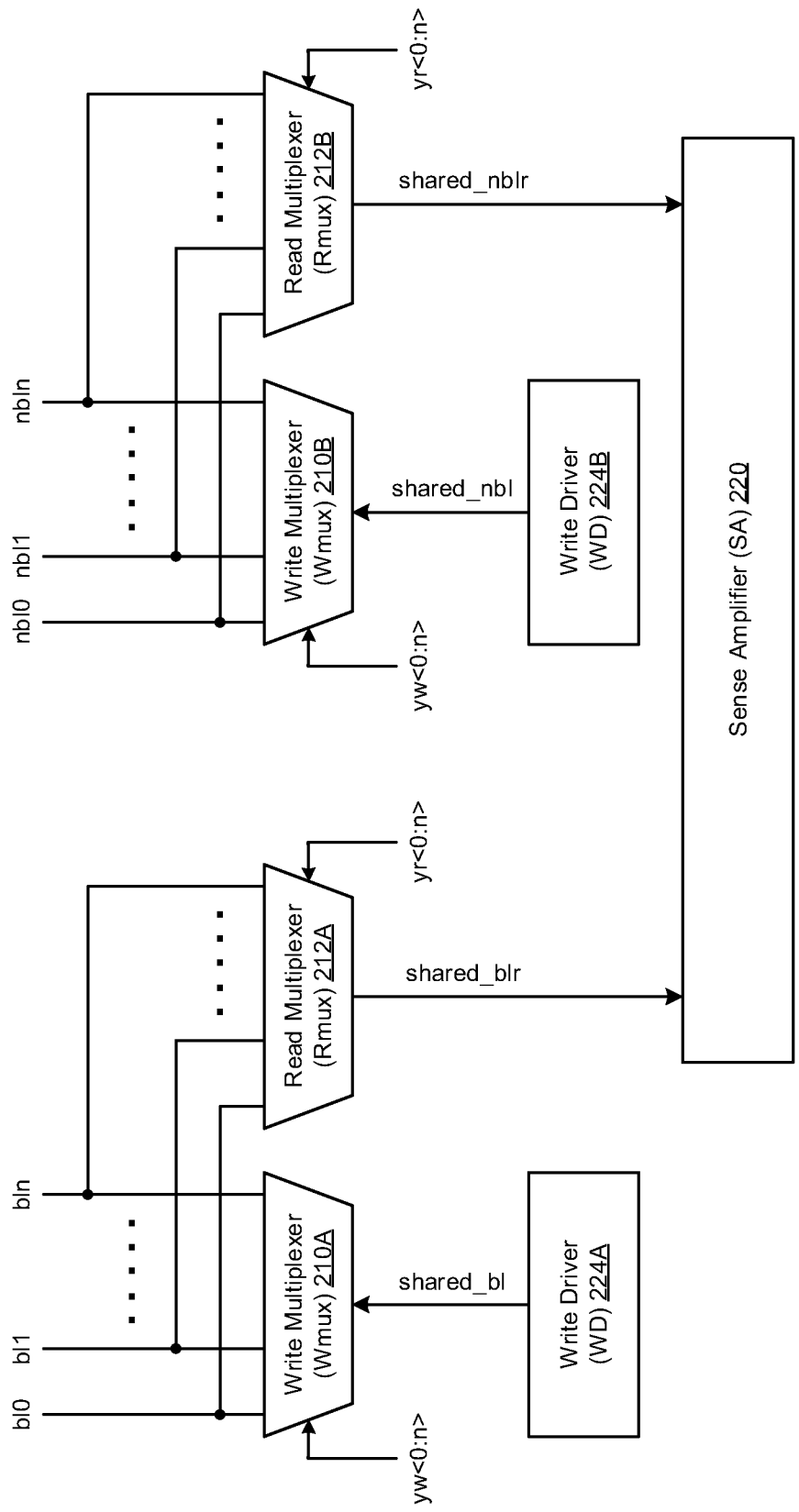
FIG. 2 illustrates a diagram of column multiplexer circuitry in accordance with various implementations described herein.

FIG. 2 illustrates a diagram of column multiplexer circuitry 200 in accordance with implementations described herein. In some implementations, the column multiplexer circuitry 200 may be referred to as a transistor-level colmux 202. The memory described herein may refer to single port memory, and the read-write column multiplexer circuitry may refer to dual column multiplexer circuitry (dual y-mux circuitry).

As shown in FIG. 2, the colmux 202 may include multiple circuit components that are arranged for column multiplexing of memory, and in this instance, the colmux 202 may include a first write multiplexer (Wmux) 210A, a first read multiplexer (Rmux) 212A, a first write driver (WD) 224A, and a sense amplifier (SA) 220. The colmux 202 may include any number (n) of multiple bitlines (bl0, bl1, . . . , bln) that are coupled to the first write multiplexer (Wmux) 210A and the first read multiplexer (Rmux) 212A. The first write multiplexer (Wmux) 210A may receive multiple bitline signals from the multiple bitlines (bl0, bl1, . . . , bln) and provide an output write signal as a shared bitline signal via a shared bitline (shared_bl) to the first write driver 224A based on a write select signal (yw<0:n>). Also, the first read multiplexer (Rmux) 212A may receive multiple bitline signals from the multiple bitlines (bl0, bl1, . . . , bln) and provide an output read signal as a shared bitline signal via a shared read bitline (shared_blr) to the sense amplifier 220 based on a read select signal (yr<0:n>).

As also shown in FIG. 2, the colmux 202 may include multiple complementary circuit components arranged for column multiplexing of memory, and in this instance, the colmux 202 includes a second write multiplexer (Wmux) 210B, a second read multiplexer (Rmux) 212B, a second write driver (WD) 224B, and the sense amplifier (SA) 220. The colmux 202 may include any number (n) of complementary bitlines (nbl0, nbl1, . . . , nbln) that are coupled to the second write multiplexer (Wmux) 210B and the second read multiplexer (Rmux) 212B. The second write multiplexer (Wmux) 210B receives multiple complementary bitline signals from the complementary bitlines (nbl0, nbl1, . . . , nbln) and provides a complementary output write signal as a shared bitline signal via a shared bitline (shared_nbl) to the second write driver 224B based on the write select signal (yw<0:n>). The second read multiplexer (Rmux) 212A receives the multiple bitline signals from the complementary bitlines (nbl0, nbl1, . . . , nbln) and provides a complementary output read signal as a shared complementary bitline signal via a shared read bitline (shared_nblr) to the sense amplifier 220 based on the read select signal (yr<0:n>).

Figure 3A:
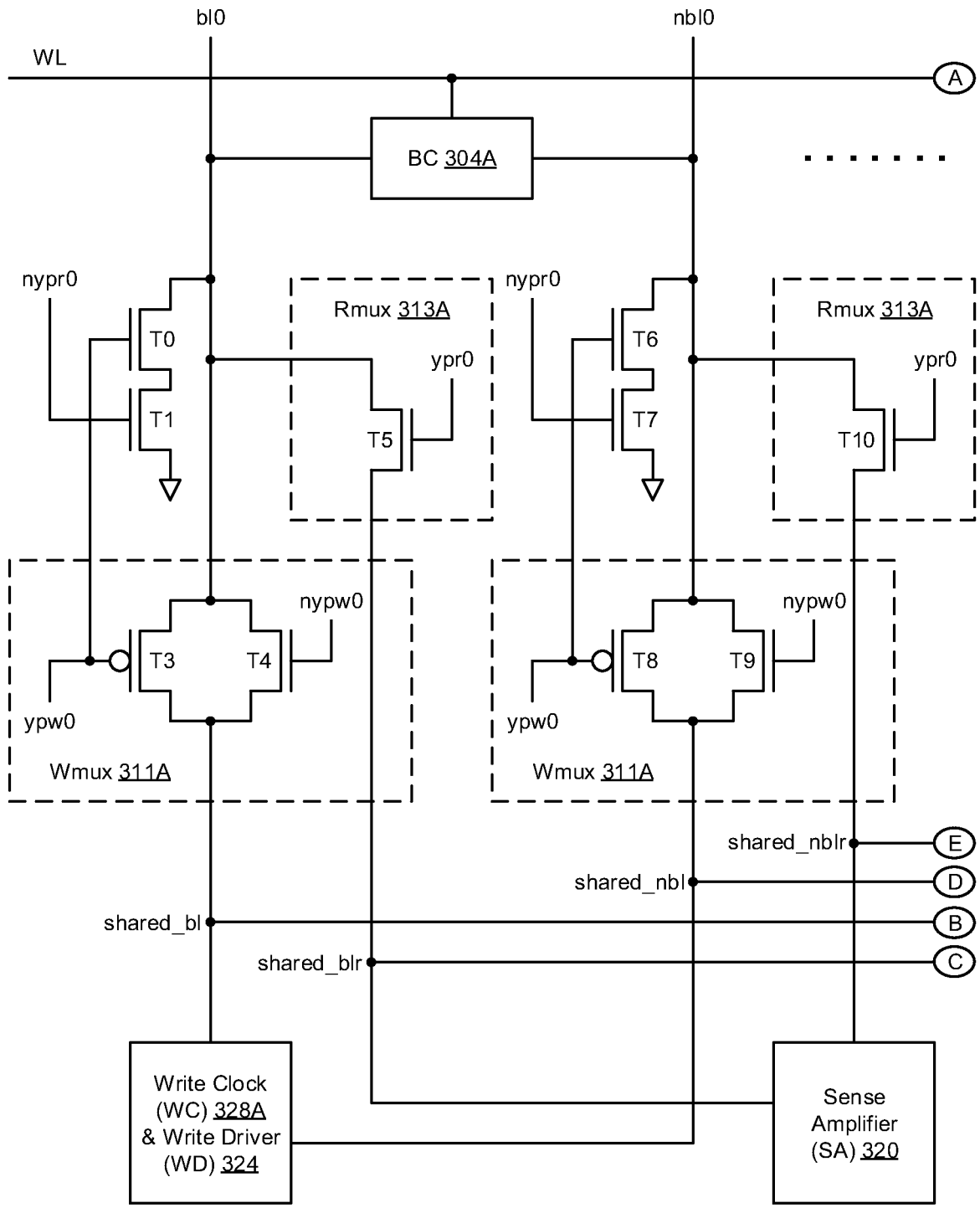
FIGS. 3A-3C illustrate column multiplexer circuitry in accordance with various implementations described herein.
Figure 3B:
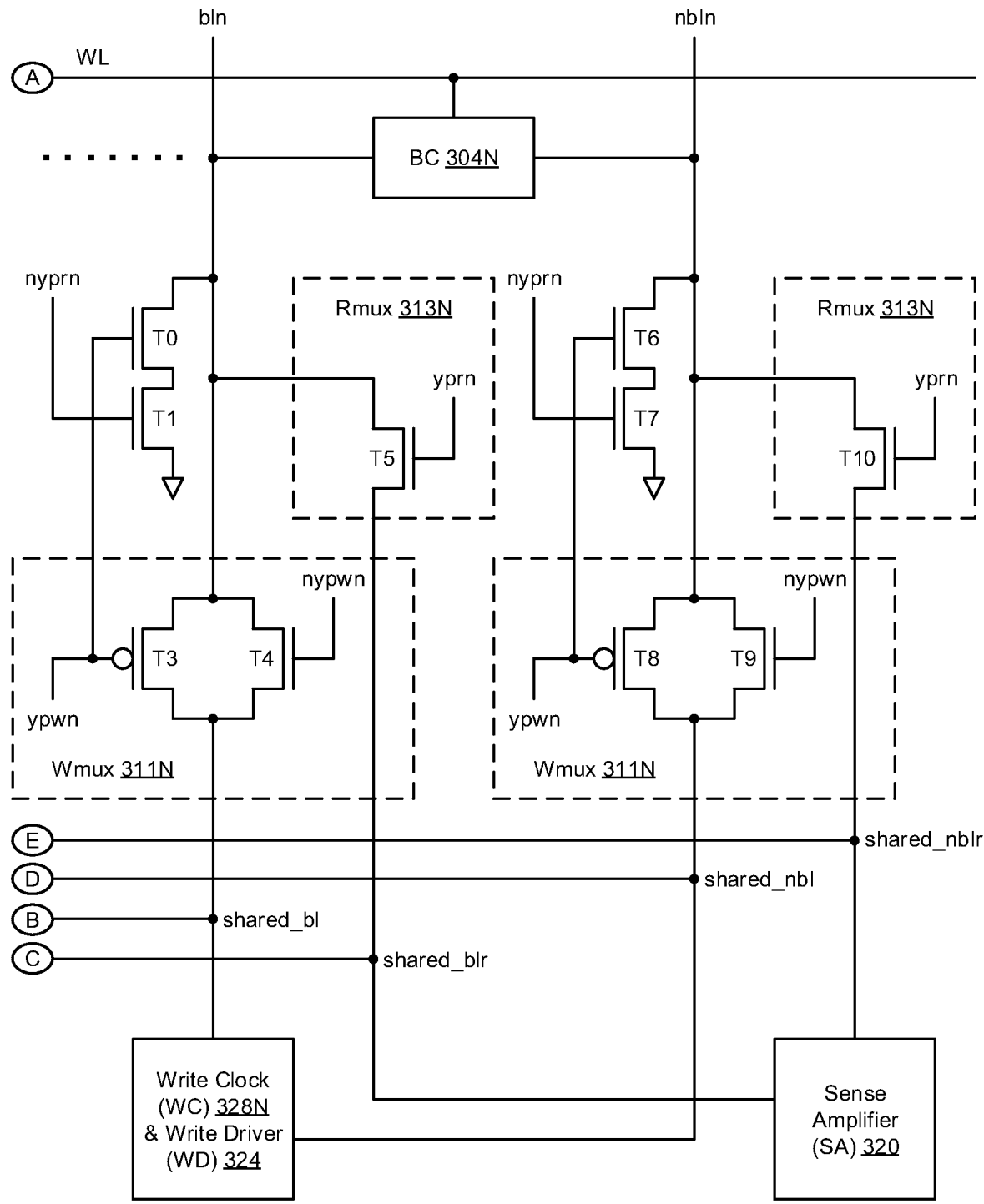
Figure 3C:
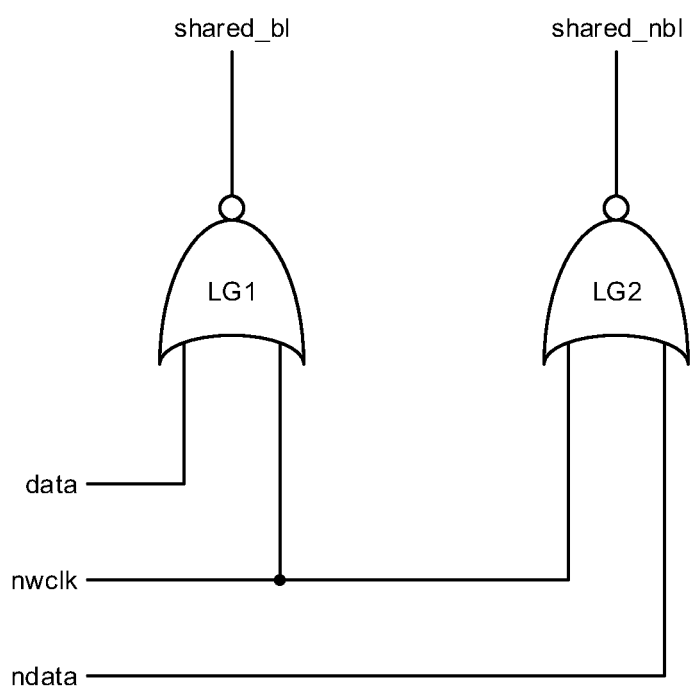

FIGS. 3A-3C illustrate column multiplexer circuitry 300 having write clock (wclk) circuitry 328 in accordance with implementations described herein. In particular, FIG. 3A illustrates a first part 300A of the column multiplexer circuitry 300, and FIG. 3B illustrates a second part 300B of the column multiplexer circuitry 300. Also, as shown in FIGS. 3A-3B, the first part 300A is coupled to the second part 300B via encircled elements A, B, C, D, E. Further, FIG. 3C illustrates a detailed diagram 300C of the write clock (wclk) circuitry 328, which is part of the column multiplexer circuitry 300.

In reference to FIG. 3A, the first part 300A of the column multiplexer circuitry 300 may refer to a transistor-level dual y-mux 302A. The first part 300A may include at least one bitcell 304A, write clock (WC) circuitry 328A having a write driver (WD) 324, and sense amplifier (SA) circuitry 320 coupled to complementary bitlines (bl0, nbl0), and a wordline (WL) may be coupled to the at least one bitcell 304A. The first part 300A includes precharge transistors (T0, T1) coupled in series to the bitline (bl0), wherein transistor (T0) is coupled between bitline (bl0) and transistor (T1), and transistor (T1) is coupled between transistor (T0) and ground (Vss or Gnd). The gate of transistor (T0) is coupled to the gate of pass transistor (T3), and the gate of transistor (T1) receives a read activation signal (nypr0). The first part 300A may include pass transistors (T3, T4) that are coupled in parallel between bitline (bl0) and the write clock (WC) circuitry 328A. The gate of transistor (T3) receives a write activation signal (ypw0), and the gate of transistor (T4) receives a complementary write activation signal (nypw0). The first part 300A may include another pass transistor (T5) that is coupled between the bitline (bl0) and the sense amplifier (SA) 320, and the gate of transistor (T5) receives a complementary read activation signal (ypr0). In some instances, transistors (T3, T4) may operate as part of write multiplexer circuitry (Wmux) 311A, and transistor (T5) may operate as part of read multiplexer circuitry (Rmux) 313A.

Further, in reference to bitline (nbl0), the first part 300A may include precharge transistors (T6, T7) coupled in series to the bitline (nbl0), wherein transistor (T6) is coupled between bitline (nbl0) and transistor (T7), and transistor (T7) is coupled between transistor (T6) and ground (Vss or Gnd). The gate of transistor (T6) is coupled to the gate of pass transistor (T8), and the gate of transistor (T7) receives the read activation signal (nypr0). The first part 300A may also include pass transistors (T8, T9) that are coupled in parallel between bitline (nbl0) and the write clock (WC) circuitry 328A. Also, the gate of transistor (T8) receives the write activation signal (ypw0), and the gate of transistor (T9) receives the complementary write activation signal (nypw0). In addition, the first part 300A includes another pass transistor (T10) coupled between the bitline (nbl0) and the sense amplifier (SA) 320, and the gate of transistor (T10) receives the complementary read activation signal (ypr0). In some instances, transistors (T8, T9) operate as part of write multiplexer circuitry (Wmux) 311A, and transistor (T10) may operate as part of read multiplexer circuitry (Rmux) 313A. Also, the write clock (WC) circuitry 328A and the sense amplifier (SA) 320 may be cross-coupled between the bitlines (bl0, nbl0).

In some implementations, the first part 300A refers to a first column structure in an array of bitcells, and the second part 300B refers another column structure in the same array of bitcells. The array of bitcells may include any number (N) of columns and any number (N) of column structures to support read and write memory access operations as described herein. Therefore, as shown in FIGS. 3A-3B, the second part 300B may have similar components with similar scope and features as the first part 300A.

In FIG. 3B, the second part 300B of the column multiplexer circuitry 300 may refer to another transistor-level dual y-mux 302B. The second part 300B may include at least one bitcell 304N, write clock (WC) circuitry 328N having the write driver (WD) 324, and sense amplifier (SA) circuitry 320 coupled to complementary bitlines (bln, nbln), and the wordline (WL) may be coupled to the at least one bitcell 304B. Similar to the first part 300A, the second part 300B may include precharge transistors (T0, T1) coupled in series to the bitline (bln), wherein transistor (T0) is coupled between bitline (bln) and transistor (T1), and transistor (T1) is coupled between transistor (T0) and ground (Vss or Gnd). The gate of transistor (T0) is coupled to the gate of pass transistor (T3), and the gate of transistor (T1) receives a read activation signal (nyprn). The second part 300B may include pass transistors (T3, T4) that are coupled in parallel between bitline (bln) and the write clock (WC) circuitry 328N, wherein the gate of transistor (T3) receives a write activation signal (ypwn), and the gate of transistor (T4) receives a complementary write activation signal (nypwn). Also, the second part 300B may include another pass transistor (T5) that is coupled between the bitline (bln) and the sense amplifier (SA) circuitry 320, and also, the gate of transistor (T5) receives a complementary read activation signal (yprn). In some instances, transistors (T3, T4) may operate as part of write multiplexer circuitry (Wmux) 311N, and also, transistor (T5) may operate as part of read multiplexer circuitry (Rmux) 313N.

Also, in reference to bitline (nbln), the second part 300B may include precharge transistors (T6, T7) coupled in series to the bitline (bln), wherein transistor (T6) is coupled between bitline (bln) and transistor (T7), and transistor (T7) is coupled between transistor (T6) and ground (Vss or Gnd). The gate of transistor (T6) is coupled to the gate of pass transistor (T8), and the gate of transistor (T7) receives a read activation signal (nyprn). The second part 300B may include pass transistors (T8, T9) that are coupled in parallel between bitline (bln) and the write clock (WC) circuitry 328N, wherein the gate of transistor (T8) receives the write activation signal (ypwn), and the gate of transistor (T9) receives the complementary write activation signal (nypwn). In addition, the second part 300B may include another pass transistor (T10) that is coupled between the bitline (bln) and the sense amplifier (SA) circuitry 320, and also, the gate of transistor (T10) receives the complementary read activation signal (yprn). In some instances, transistors (T8, T9) may operate as part of write multiplexer circuitry (Wmux) 311N, and transistor (T10) may operate as part of read multiplexer circuitry (Rmux) 313N. Also, the write clock (WC) circuitry 328N and the sense amplifier (SA) circuitry 320 may be cross-coupled between the bitlines (bin, nbln).

In some implementations, as shown in FIGS. 3A-3B, the wordline (WL) may be coupled together via encircled element A. Bitline (bl0) in the first part 300A and bitline (bln) in the second part 300B may be coupled together as a shared bitline (shared_bl) via the encircled element B, and read bitline (blr0) in the first part 300A and read bitline (nblr) in the second part 300B may be coupled together as a shared read bitline (shared_blr) via the encircled element C. Further, bitline (nbl0) in the first part 300A and bitline (nbln) in the second part 300B may be coupled together as another shared bitline (shared_nbl) via the encircled element D, and read bitline (nblr) in the first part 300A and read bitline (nblr) in the second part 300B may be coupled together as another shared read bitline (shared_nblr) via the encircled element E.

As shown in FIG. 3C, the write clock (wclk) circuitry 328 may include one or more logic gates (e.g., LG1, LG2) that receive input signals (e.g., data, ndata, nwclk) and provides output signals (e.g., shared_bl, shared_nbl). For instance, a first logic gate (LG1) may include use of a NOR gate, and the first logic gate (LG1) may receive input signals (data, nwclk) and provide an output signal (shared_bl). Also, a second logic gate (LG2) may include use of a NOR gate, and the second logic gate (LG2) may receive input signals (ndata, nwclk) and provide an output signal (shared_nbl). In some instances, the input data signal and the input ndata signal may be complementary, and the input nwclk signal may refer to a complement to the write clock signal (wclk). Also, in some instances, the output signals (shared_bl, shared_nbl) may be complementary shared bitline signals. In some implementations, the write clock (WC) circuitry 328A, 328N may be used in the column multiplexer circuitry 300 of FIGS. 3A-3B.

Figure 4:
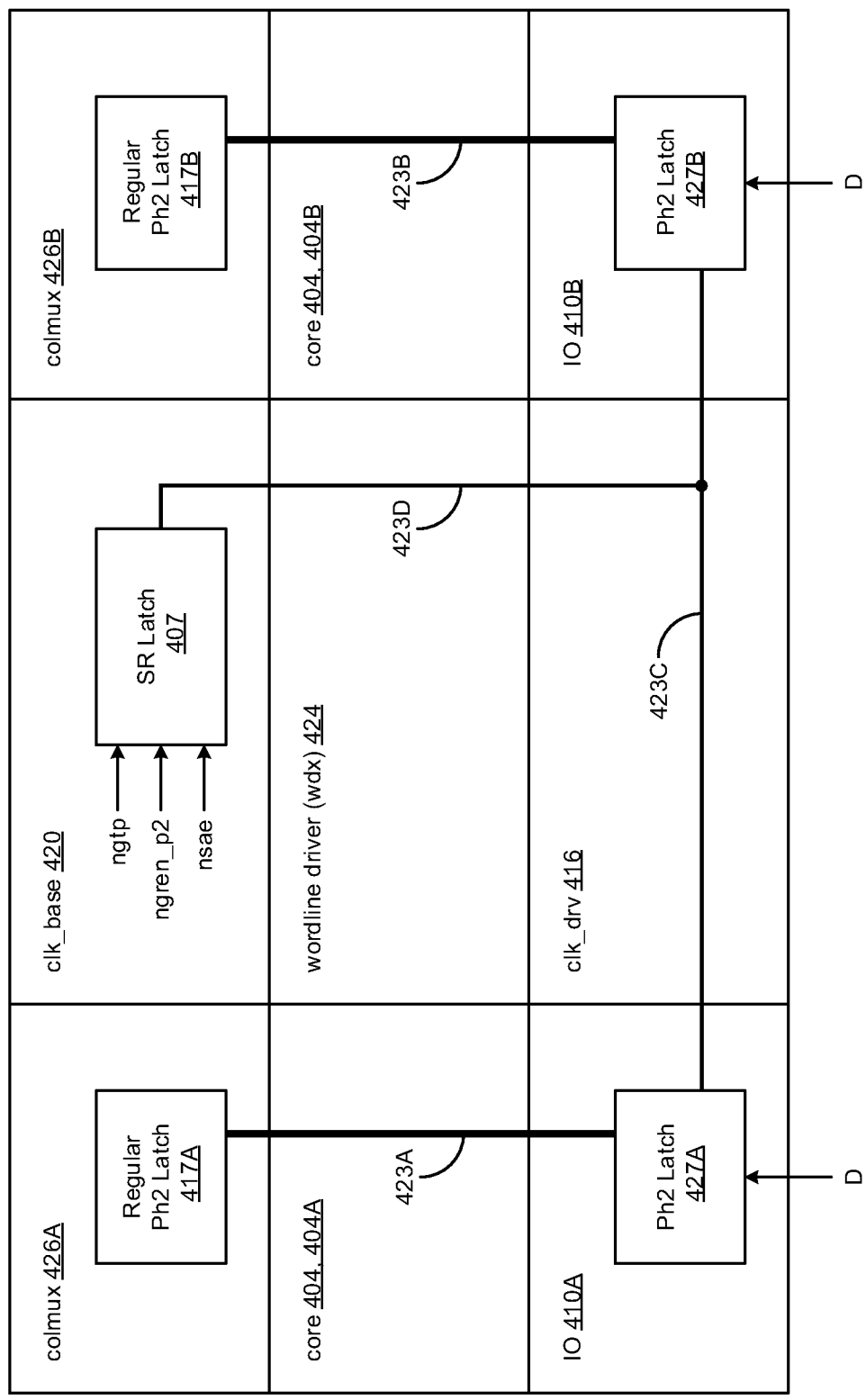
FIG. 4 illustrates a diagram of memory circuitry in accordance with various implementations described herein.

FIG. 4 illustrates a diagram of memory circuitry in accordance with various implementations described herein. As shown in FIG. 4, the memory circuitry 400 may be implemented with one or more memory blocks with various types of control cells that are arranged and configured to provide various memory related components.

The memory circuitry 400 shown in FIG. 4 may include multiple memory core arrays 404, such as, e.g., a multi-core array. However, in various other instances, a single core array and/or a dual core array may be used in some embodiments. Thus, as shown in FIG. 4, the memory instance 400 may include multiple memory cores (e.g., multiple core arrays 404A, 404B in a multi-memory core configuration), and the memory instances may share one or more control cells, such as, e.g., colmux (426A, 426B), clk_base (420), wdx (424), clk_dry (416), input-output (IO) (410A, 410B), which in various instances, may represent shared circuit components.

As shown in FIG. 4, a first colmux 426A may include a first regular ph2 latch 417A and a second colmux 426B may include a second regular ph2 latch 417B. In some instances, the ph2 latch opens at the falling edge of the clock and is opaque at the rising edge of the clock, while ph1 operates in an opposite manner (i.e., opens at the rising edge of the clock and opaque at the falling edge of the clock. Also, a first IO 410A may include a first ph2 latch 427A, and also, a second IO 410B may include a second ph2 latch 427B. As shown, the first regular ph2 latch 417A may be coupled to the first ph2 latch 427A via a conductive line 423A, and the second regular ph2 latch 417B may be coupled to the second ph2 latch 427A via another conductive line 423B. Also, as shown, the first ph2 latch 427A may be coupled to the second ph2 latch 427B via another conductive line 423C. In addition, the clk_base 420 may include an SR latch 407 that is coupled to the ph2 latches 427A, 427B via conductive lines 423C, 423D. As shown, the SR latch 407 may receive various input signals (e.g., ngtp, ngren, nsae). For instance, the SR latch 407 may receive a complementary global timing pulse (ngtp), and the SR latch 407 may receive a complementary global read enable signal (ngren_p2). Also, the SR latch 407 may receive a complementary sense amplifier enable signal (nsae).

In some implementations, when GREN=0 (global read enable active low), then only the clock latch 407 (clk_latch or SR latch) will go high, which will close the ph2 latch 427A, 427B added at the lower (or bottom) IO. Otherwise, the ph2 latch 427A, 427B at the bottom IO may be transparent, and the SR latch will be transparent once the read operation is done (e.g., when ph1_read_end will go high). This may happen earlier than a falling edge of the gtp signal. Thus, this latching technique may avoid the race condition from bottom ph2 latch to middle ph2 latch (which may be controlled with wclk).

Figure 5A:
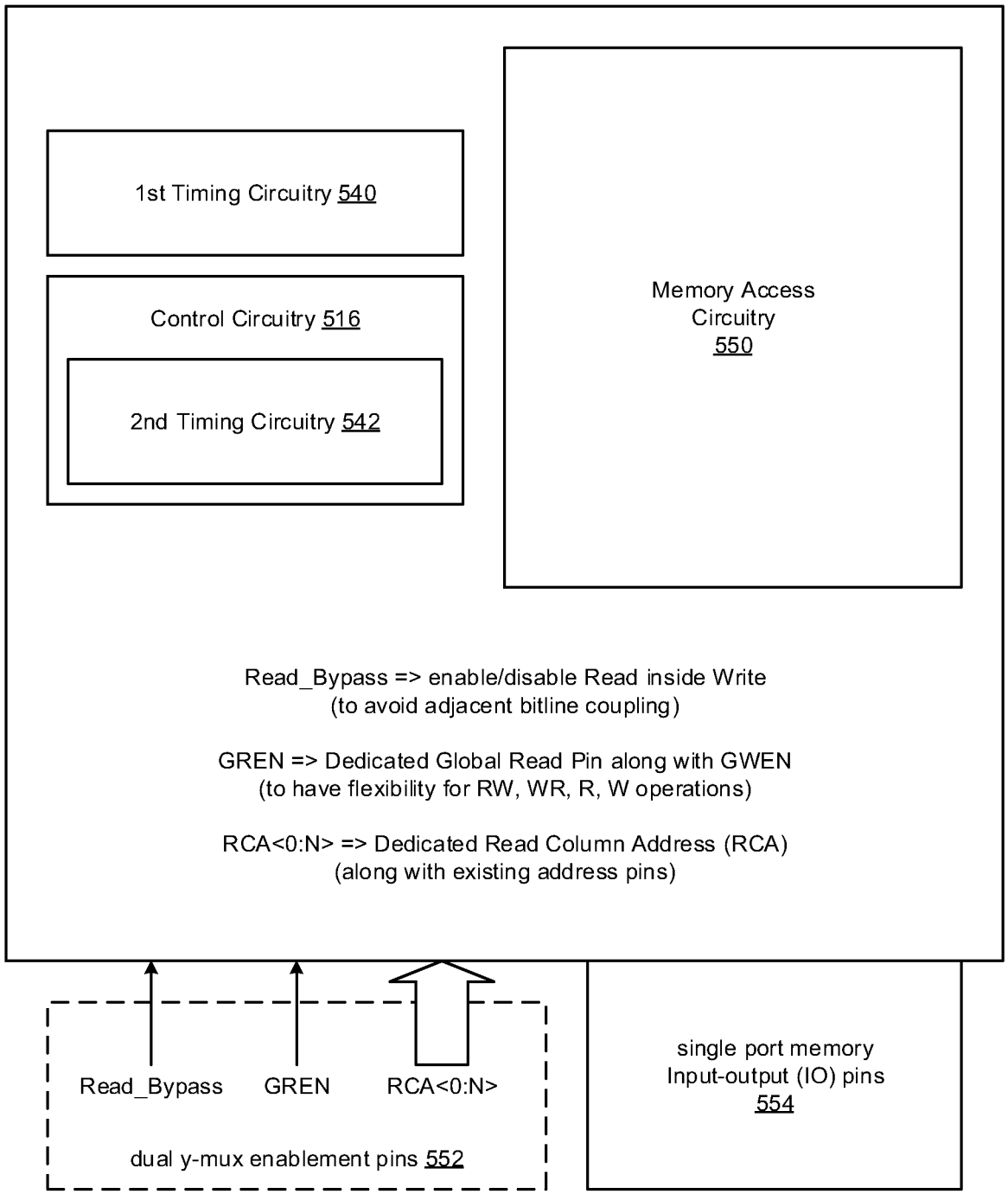
FIGS. 5A-5F illustrates various diagrams of memory circuitry in accordance with various implementations described herein.
Figure 5B:
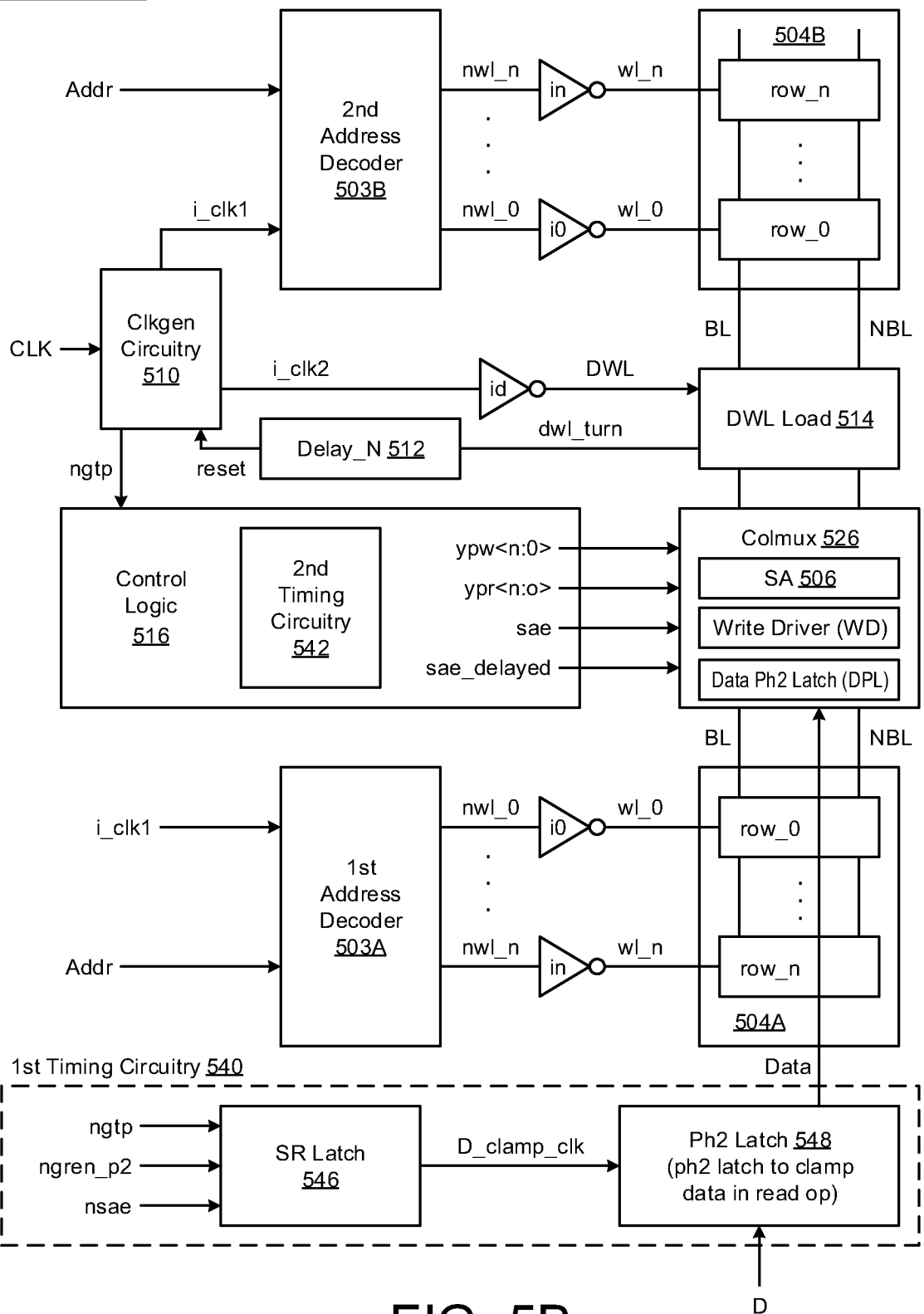
Figure 5C:
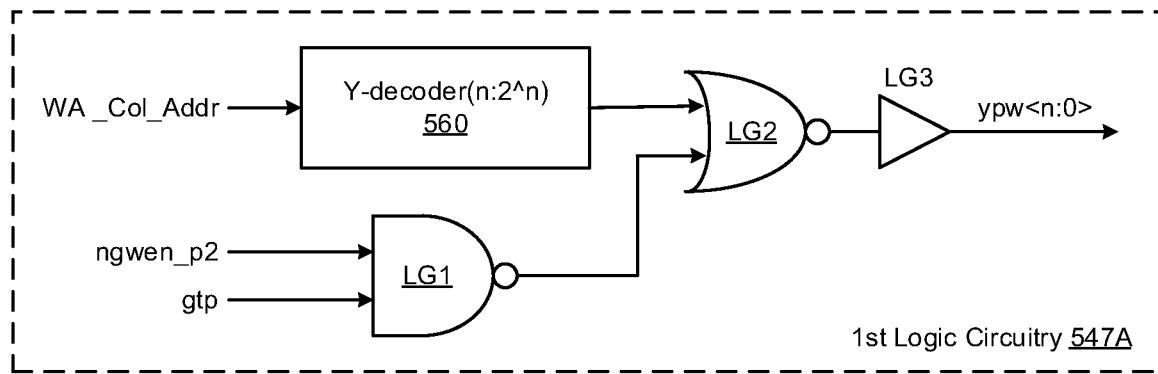
Figure 5C:
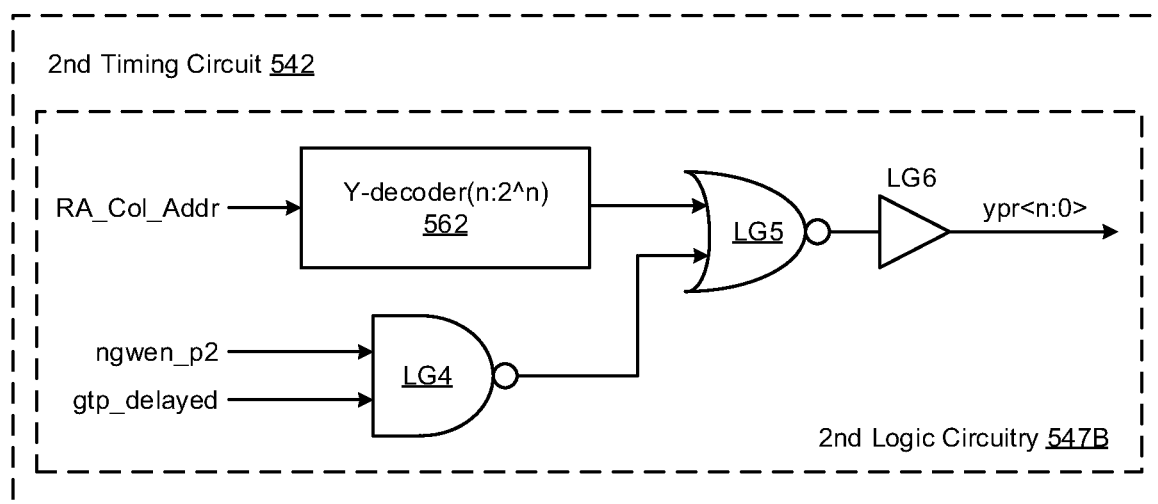
Figure 5C:
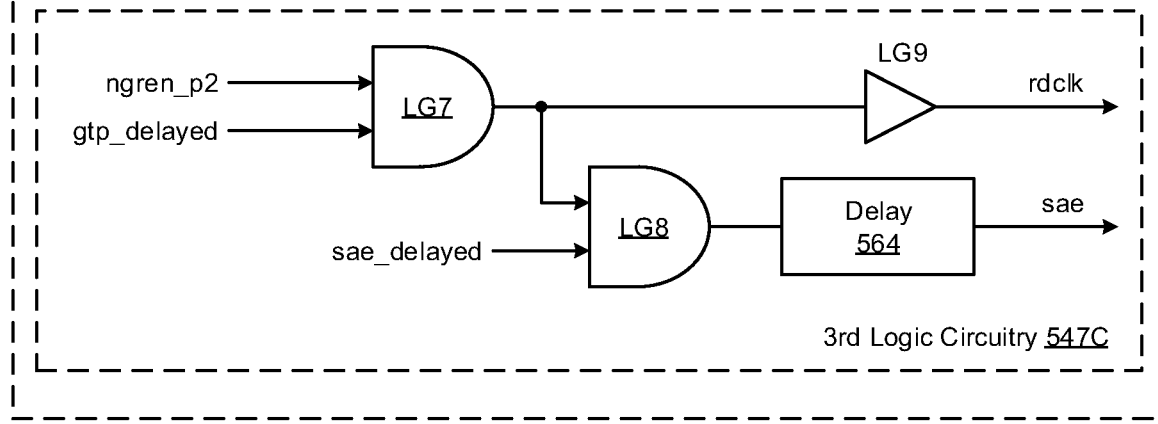
Figure 5D:
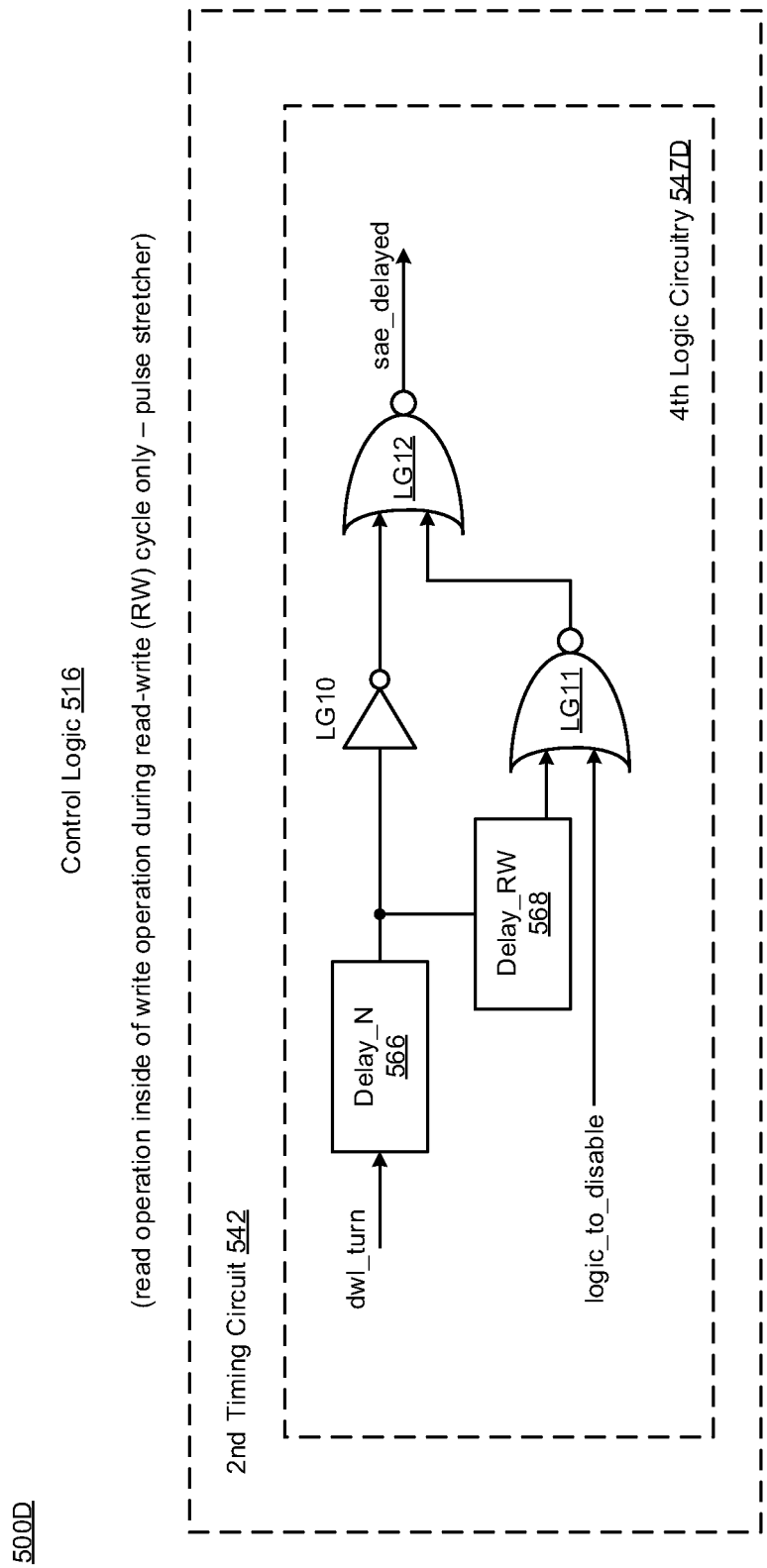
Figure 5E:
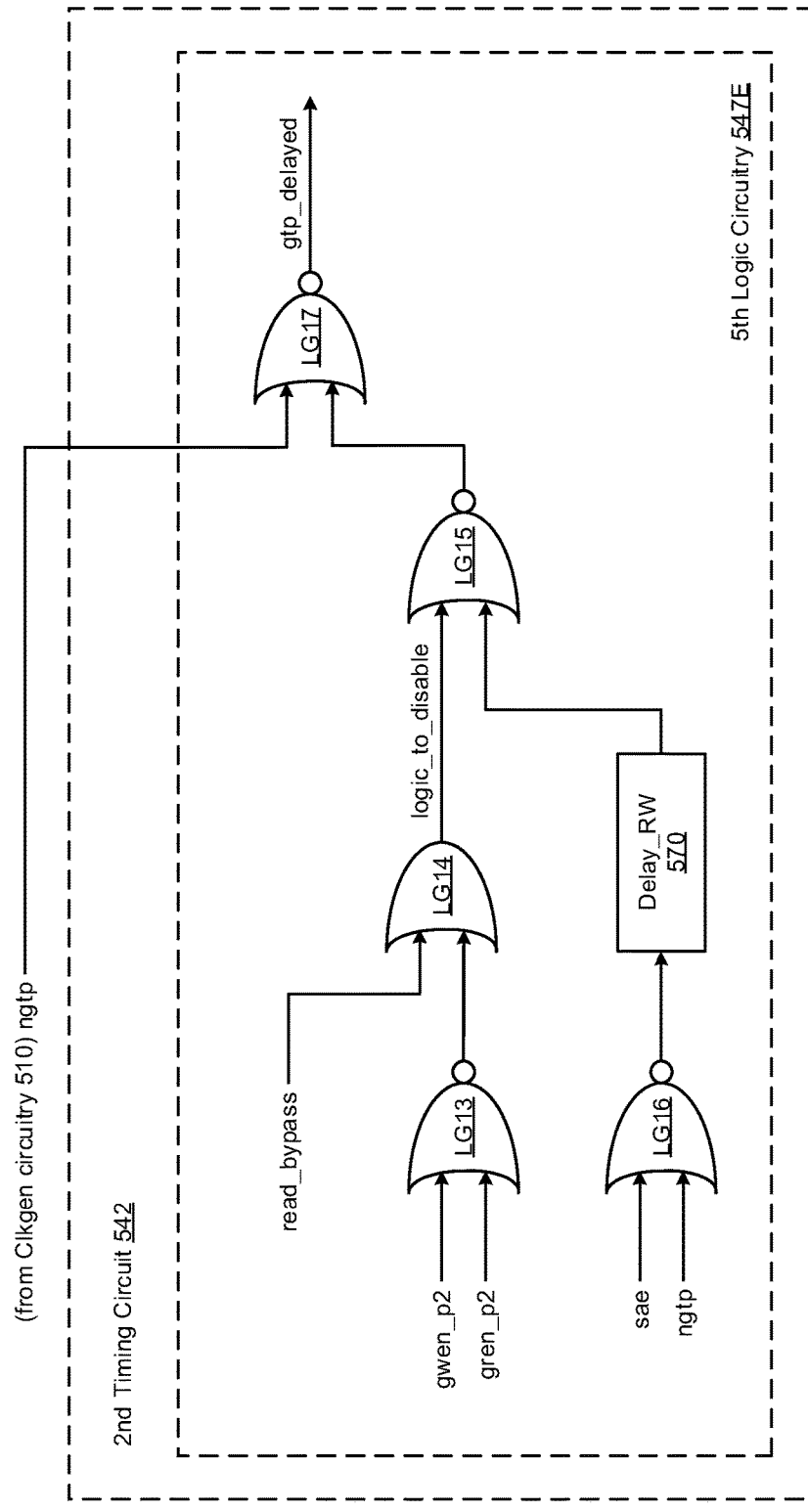
Figure 5F:
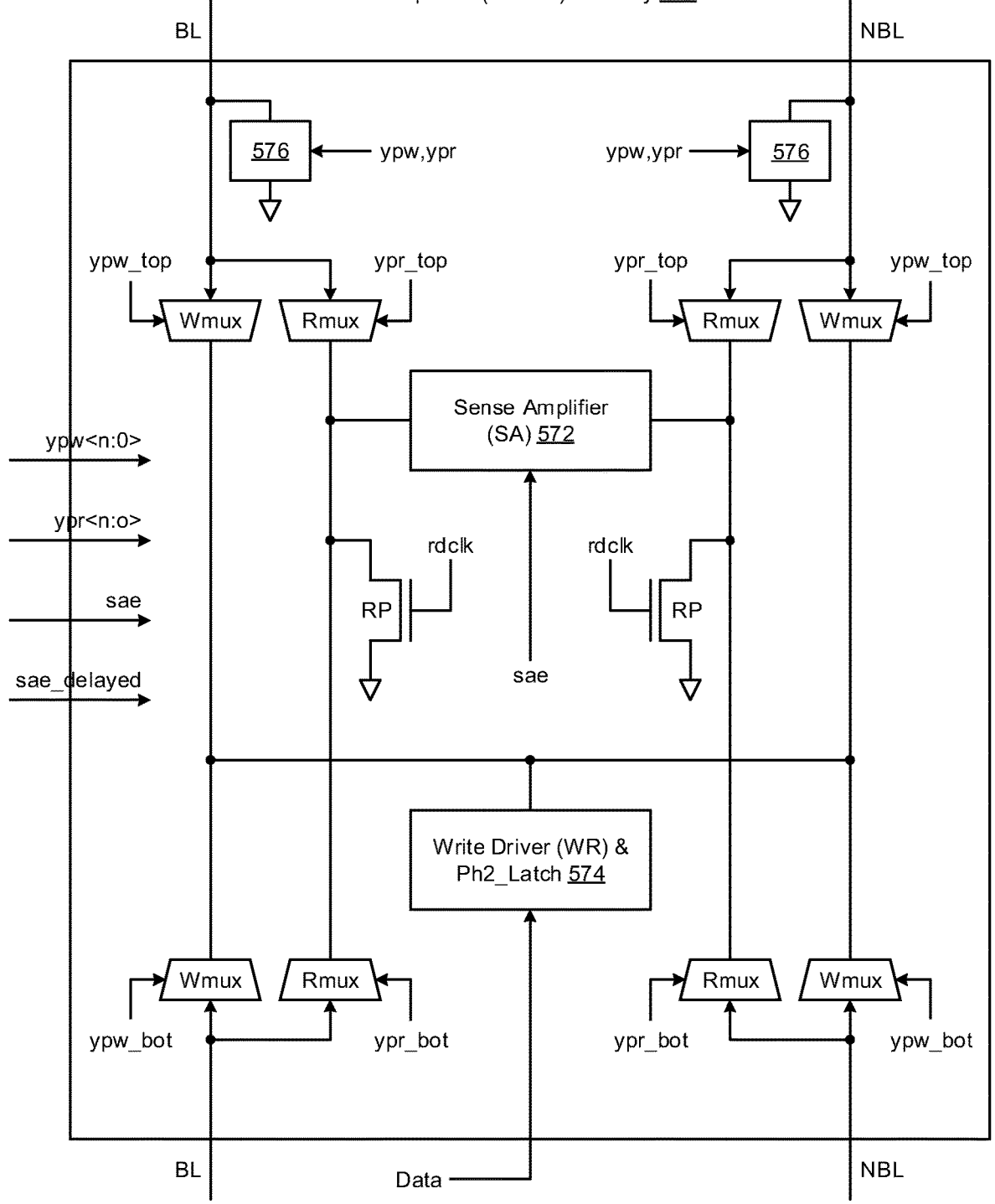

FIGS. 5A-5F illustrate various diagrams of memory circuitry in accordance with various implementations described herein. In particular, FIG. 5A shows a diagram 500A of memory circuitry 502 having control logic 516, FIG. 5B shows a more detailed diagram 500B of memory circuitry 502 having column multiplexer circuitry 526, FIG. 5C shows a diagram 500C of the control logic 516, FIG. 5D shows another diagram 500D of the control logic 516, and FIG. 5E shows another diagram 500D of the control logic 516. Also, FIG. 5F shows a diagram 500F of the column multiplexer circuitry 526.

As shown in FIG. 5A, the memory circuitry 502 may include control circuitry 516, first timing circuitry 540, second timing circuitry 542, and memory access circuitry 550 that are arranged and configured for concurrent memory access operations. In some instances, the memory circuitry 502 may be implemented as a system or device having various circuit components that are arranged and coupled together as an assemblage or combination of parts that provide for a physical circuit design and related structures. Also, in other instances, a method of designing, providing and building the memory circuitry 502 may involve use of the various circuit components described herein so as to implement column multiplexing schemes and techniques associated therewith.

The memory circuitry 502 may include the control circuitry 516, the first timing circuitry 540, and the memory access circuitry 550, wherein the control circuitry 516 may include the second timing circuitry 542. The memory circuitry 502 may include dual y-mux enablement pins 552, wherein the memory circuitry 502 may be configured to receive multiple input signals (e.g., Read_Bypass, GREN, RCA<0:N>). The memory circuitry 502 may also include single port memory input-output (IO) pins 554. In some instances, the read_bypass signal may refer to a control signal that is used to enable/disable a read operation inside of a write operation so as to thereby avoid adjacent bitline coupling. Also, in some instances, the GREN signal may refer to a global read enable signal along with a global write enable signal (GWEN) so as to provide flexibility for read-write (RW), write-read (WR), read only (R), and write only (W) operations. In reference to the dual y-mux enablement pins 552, the GREN signal may be received by a dedicated global read pin, and the GWEN signal may be received by a dedicated global write pin. Also, in some instances, the RCA<0:N> signal may refer to a dedicated read column address (RCA) signal along with existing address (Addr) signals, and also, the pins 552 may include a dedicated RCA pin along with existing Addr pins. In addition, the pins 552 may include a dedicated write column address (WCA) pin for receiving a dedicated WCA<0:N>.

As shown in FIG. 5B, the memory circuitry 502 may include various circuitry including multiple address decoders 503A, 503B, multiple banks of bitcell arrays 504A, 504B, column multiplexer circuitry 536, sense amplifier circuitry 506, clock generation circuitry 510, and dummy wordline (DWL) circuitry related to DWL load 514. The memory circuitry 502 may also include the first timing circuitry 540 and the control logic 516 having the second timing control circuitry 542. Also, the memory circuitry 502 may include the dummy wordline (DWL) driver (id), the dummy wordline (DWL) load 514, and delay logic (Delay_N) 512 that are coupled to the dummy wordline DWL.

The multiple address decoders 503A, 503B may include a first address decoder 503A and a second address decoder 503B, and the multiple banks of bitcell arrays 504A, 504B may include a first bitcell array 504A and a second bitcell array 504B. In various instances, each of the bitcell arrays 504A, 504B may have multiple rows of bitcells row_0, row_1, row_2, ..., row_n. The column multiplexer (Colmux) 526 and the sense amplifier 506 may be coupled to each of the bitcells in each of the rows of bitcells row_0, row_1, row_2, ..., row_n via complementary bitlines (BL, NBL). Also, each of the bitcell arrays 504A, 504B may utilize a number of inverted wordlines (e.g., nwl_0, nwl_1, nwl_2, ..., nwl_n) that are coupled between the address decoders 503A, 503B and corresponding rows of bitcells row_0, row_1, row_2, ..., row_n for access to each of the bitcells based on selected wordlines. Each of the inverted wordlines nwl_0, nwl_1, nwl_2, ..., nwl_n have a corresponding wordline drivers (e.g., inverters i0, i1, i2, ..., in) coupled thereto to provide wordlines signals (e.g., wl_0, wl_1, wl_2, ..., wl_n) to the corresponding rows of bitcells row_0, row_1, row_2, ..., row_n. As described herein, the memory circuitry 502 may utilize dual wordlines for concurrent memory access operations. In some instances, the column multiplexer (Colmux) 526 may include sense amplifier (SA) circuitry 506, write driver (WD) circuitry, and data ph2 latch circuitry (DPL).

The memory circuitry 502 may receive a clock signal CLK and an address signal Addr. The clock generation circuitry (Clkgen) 510 may receive the clock signal CLK and provide one or more internal clock signals, such as, e.g., a first internal clock signal i_clk1 to the address decoders 503A, 503B and a second internal clock signal i_clk2 to a dummy wordline driver (e.g., inverter id) via a dummy wordline (DWL). The DWL load 514 may receive the DWL signal from the DWL driver (id) and provide a DWL turn signal (dwl_turn) to the delay logic (Delay_N) 512, and the delay logic (Delay_N) 512 provides a reset signal to Clkgen circuitry 510. In addition, the address decoders 503A, 503B may receive multiple signals including, e.g., the address signal Addr and the first internal clock signal i_clk1 and then access at least one inverted wordline (e.g., nwl_0, nwl_1, nwl_2, ..., nwl_n) based on the received address signal Addr.

The memory circuitry 502 may include the control logic circuitry 516 coupled between the clock generation circuitry (Clkgen) 510 and the column multiplexer 526. The control circuitry 516 may receive a complementary global timing pulse (ngtp) and provide various timing and control signals to the column multiplexer 526 and the sense amplifier 506. For instance, the column multiplexer 526 may utilize the second timing circuitry 542 to generate and provide multiple y-mux signals (ypw<n:0>, ypr<n:0>) and multiple sense amplifier enable signals (sae, sae_delayed). The second timing circuitry 542 is described in greater detail herein below in reference to FIGS. 5C-5F.

The first timing circuitry 540 may include latch circuitry including, e.g., a first latch 546 and a second latch 548. In some instances, the first latch 546 may be an SR latch that is configured to receive multiple input signals (e.g., ngtp, ngren_p2, nsae) and provide a data clamping clock (D_clamp_clk) signal to the second latch 548. Also, in this instance, the second latch 548 may be a ph2 latch that is configured to receive the data clamping clock (D_clamp_clk) signal from the first latch 546, receive a data signal (D) from an external source, and provide another data signal (Data) to the column multiplexer 526. The first timing circuitry 540 is described in greater detail herein below in reference to FIGS. 5C-5F.

In various implementations, each bitcell in the bitcell arrays 504A, 504B may be referred to as a memory cell, and each bitcell may be configured to store at least one data bit value (e.g., a data value associated with logical '0' or '1'). Each row of bitcells row_0, row_1, row_2, . . . , row_n in the bitcell arrays 504A, 504B may include any number of memory cells arranged in various configurations, such as, e.g., a two-dimensional (2D) memory array having columns and rows of multiple bitcells arranged in a 2D grid pattern. Each bitcell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In other instances, each bitcell may include a multi-layer MRAM bitcell having free-layers and pinned layers, e.g., when tracking may be needed on an associated CLK2Q path.

The memory circuitry 502 including each bitcell in the bitcell arrays 504A, 504B may be implemented as an integrated circuit (IC) with various types of memory circuitry, such as, e.g., random access memory (RAM). The memory circuitry 502 may also be integrated with computing circuitry and related components on a single chip. Further, the memory circuitry 502 may be implemented in an embedded system for various types of electronic, mobile, biometric and/or IoT (Internet-of-Things) applications.

In some implementations, in reference to FIG. 5B, the memory circuitry 502 includes memory architecture having one or more bitcell arrays 504A, 504B, and also, the memory circuitry 502 includes column multiplexer circuitry (Colmux 526) coupled to the memory architecture via multiple bitlines (BI, NBL) including a write column multiplexer coupled to the bitlines for write access operations and a read column multiplexer coupled to the bitlines for read access operations. The memory circuitry 502 includes logic circuitry 516 that performs concurrent memory access operations in the one or more bitcell arrays 504A, 504B of the memory architecture with the write column multiplexer and the read column multiplexer via the bitlines. In some instances, the bitcell arrays 504A, 504B may refer to multiple different bitcell arrays, and also, performing concurrent memory access operations may refer to performing concurrent read operations and write operations in the multiple different bitcell arrays with the same column. Also, in other instances, performing concurrent memory access operations my refer to performing concurrent read operations and write operations in the multiple different bitcell arrays with different columns. In some instances, performing concurrent memory access operations may also refer to performing concurrent read operations and write operations in the one or more bitcell arrays in the same bank with different columns. Also, the memory architecture may refer to single port memory structure, and the column multiplexer circuitry may be dual read-write column multiplexer circuitry (e.g., dual Y-mux circuitry). The write column multiplexer may refer to a dedicated write column multiplexer that is coupled to the bitlines for performing write operations controlled by a write column multiplexer address (WCA), and the read column multiplexer may refer to a dedicated read column multiplexer that is coupled to the bitlines for performing read operations controlled by a read column multiplexer address (RCA).

As shown in FIG. 5C, the control logic 516 may include various logic circuitry including first logic circuitry 547A having a Y-decoder(n:2^n) 560 and one or more logic gates (e.g., LG1, LG2, LG3) that are coupled together and arranged to receive one or more input signals (e.g., WA_Col_Addr, ngwen_p2, gtp) and provide an output signal (e.g., ypw<n:0>). The Y-decoder(n:2^n) 560 receives the WA_Col_Addr (WCA) signal and provides an output signal to a second logic gate LG2 (e.g., NOR gate). Also, a first logic gate LG1 (e.g., NAND gate) receives input signals (ngwen_p2, gtp) and provides an output signal to the second logic gate LG2. The second logic gate LG2 receives the output signals from the Y-decoder(n:2^n) 560 and the first logic gate LG1 and provides an output signal to a third logic gate LG3 (e.g., buffer). Also, in some instances, the third logic gate LG3 may receive the output signal from the second logic gate LG2 and provides the output signal (ypw<n:0>).

As described herein, the control logic 516 includes the second timing circuitry 542 that may include various logic circuitry including second logic circuitry 547B and third logic circuitry 547C. The second logic circuitry 547B may include a Y-decoder(n:2^n) 562 and one or more logic gates (e.g., LG4, LG5, LG6) that are coupled together and arranged to receive one or more input signals (e.g., RA_Col_Addr, ngwen_p2, gtp_delayed) and provide an output signal (e.g., ypr<n:0>). In some instances, the Y-decoder(n:2^n) 562 receives the RA_Col_Addr (RCA) signal and provides an output signal to a fifth logic gate LG5 (e.g., NOR gate). A fourth logic gate LG4 (e.g., NAND gate) receives input signals (ngwen_p2, gtp_delayed) and provides an output signal to the fifth logic gate LG5. The fifth logic gate LG5 receives the output signals from the Y-decoder(n:2^n) 562 and the fourth logic gate LG4 and provides an output signal to a sixth logic gate LG6 (e.g., buffer). The sixth logic gate LG6 receives the output signal from the fifth logic gate LG5 and provides the output signal (ypr<n:0>).

In addition, the third logic circuitry 547C may include delay logic 564 and one or more logic gates (e.g., LG7, LG8, LG9) that are coupled together and arranged to receive one or more input signals (e.g., ngwen_p2, gtp_delayed, sae_delayed) and also provide one or more output signals (e.g., rdclk, sae). A seventh logic gate LG7 (e.g., AND gate) receives one or more input signals (e.g., ngren_p2, gtp_delayed) and provides an output signal to an eighth logic gate LG8 (e.g., AND gate) and a ninth gate LG9 (e.g., buffer). The eighth logic gate LG8 receives the output signal from the seventh logic gate LG7, receives the input signal (sae_delayed), and provides an output signal to the delay logic gate 564. The ninth logic gate LG9 receives the output signal from the eighth logic gate LG8 and provides the read clock signal (rdclk) as an output signal. The delay logic 564 receives the output signal from the eighth logic gate LG8 and provides the sense amplifier enable signal (sae) as an output signal.

As shown in FIG. 5D, the second timing circuitry 542 of the control logic 516 may include other logic circuitry including fourth logic circuitry 547D. In some instances, the fourth logic circuitry 547D may include various delay logic 566, 568 and one or more logic gates (e.g., LG10, LG11, LG12) that are coupled together and arranged to receive one or more input signals (e.g., dwl_turn, logic_to_disable) and provide an output signal (e.g., sae_delayed). In some instances, a first delay 566 (e.g., Delay_N) may receive the dwl_turn signal and provide an output signal to a second delay 568 (e.g., Delay_RW) and a tenth logic gate LG10 (e.g., inverter gate). The tenth logic gate LG10 receives the output signal from the first delay 566 and provides an output signal to a twelfth logic gate LG12 (e.g., NOR gate). The second delay 568 may receive the output signal from the first delay 566 and provide an output signal to an eleventh logic gate LG11 (e.g., NOR gate). The eleventh logic gate LG11 receives the output signal from the second delay 568, receives the input signal (logic_to_disable), and provides an output signal to the twelfth logic gate LG12. Also, the twelfth logic gate LG12 may receive the output signals from the tenth and eleventh logic gates LG10, LG11 and then provide the delayed sense amplifier signal (sae_delayed) as an output signal. In some instances, the fourth logic circuitry 547D of the second timing circuitry 542 of the control logic 516 may operate as a pulse stretcher that is configured for memory access operations that involve performing a read operation inside of a write operation during (only) a read-write (RW) cycle.

As shown in FIG. 5E, the second timing circuitry 542 of the control logic 516 may include other logic circuitry including fifth logic circuitry 547E. In some instances, the fifth logic circuitry 547E may include delay logic 570 (e.g., Delay_RW) and one or more logic gates (e.g., LG13, LG14, LG15, LG16, LG17) coupled together and arranged to receive one or more input signals (e.g., ngtp, read_bypass, gwen_p2, gren_p2, sae) and provide an output signal (e.g., gtp_delayed). In some instances, a thirteenth logic gate LG13 (e.g., NOR gate) may receive input signals (e.g., gwen_p2, gren_p2) and provide an output signal to a fourteenth logic gate LG14 (e.g., OR gate). Also, the fourteenth logic gate LG14 may receive a read bypass input signal (e.g., read_bypass), receive the output signal from the thirteenth logic gate LG13, and provide the logic-to-disable signal as an output signal to a fifteenth logic gate LG15 (e.g., NOR gate). Also, a sixteenth logic gate LG16 (e.g., NOR gate) may receive input signals (e.g., sae, ngtp) and provide an output signal to the delay logic 570. Also, the delay logic 570 may receive the output signal from the sixteenth logic gate LG16 and provide an output signal to the fifteenth logic gate LG15. The fifteenth logic gate LG15 may receive the logic-to-disable signal from the fourteenth logic gate LG14, receive the output signal form the delay logic 570, and provide an output signal to a seventeenth logic gate LG17 (e.g., NOR gate). Also, the seventeenth logic gate LG17 may receive the ngtp signal from the Clkgen circuitry 510 (FIG. 5B), receive the output signal from the fifteenth logic gate LG15, and provide the gtp_delayed signal as an output signal. In some instances, the fifth logic circuitry 547E of the second timing circuitry 542 of the control logic 516 may provide logic to avoid coupling on adjacent columns during read-write (RW) operations with little or no impact on read (only).

As shown in FIG. 5F, the column multiplexer circuitry 526 may include various circuit components that are arranged for read-write (RW) access and column multiplexing of memory, and the colmux 526 may include write multiplexers (Wmux), read multiplexers (Rmux), sense amplifier (SA) circuitry 572, and write driver (WD) circuitry 574. The write driver (WD) circuitry 574 may include latch circuitry, such as, e.g., ph2 latch circuitry. The colmux 526 may include bitlines (BL, NBL) coupled to the write multiplexers (Wmux) and the read multiplexers (Rmux). The write multiplexers (Wmux) may receive bitline signals from the bitlines (BL, NBL) and then provide output write signals to the write driver (WD) circuitry 574 based on write select signals (ypw_top, ypw_bot). Also, the read multiplexers (Rmux) may receive bitline signals from the bitlines (BL, NBL) and then provide output read signals to sense amplifier (SA) circuitry 572 based on read select signals (ypr_top, ypr_bot). The Wmux and Rmux may include upper (or top) Wmux and Rmux, and the Wmux and Rmux may include lower (or bottom) Wmux and Rmux. The write driver (WD) circuitry 574 may receive the data signal (data), and the sense amplifier (SA) circuitry 572 may receive the sense amplifier enable signal (sae). The colmux 526 may include bitline precharge circuitry 576 coupled to the bitlines (BL, NBL) that precharge the bitlines (BL, NBL) based on activation signals (ypw, ypr), and the colmux 526 may include read bitline precharge circuitry PR coupled to the bitlines (BL, NBL). Also, in some instances, the colmux 526 may receive multiple input control signals (e.g., ypw<n:0>, ypr<n:0>, sae, sae_delayed) from the control logic 516, as shown in FIG. 5B.

Figure 6:
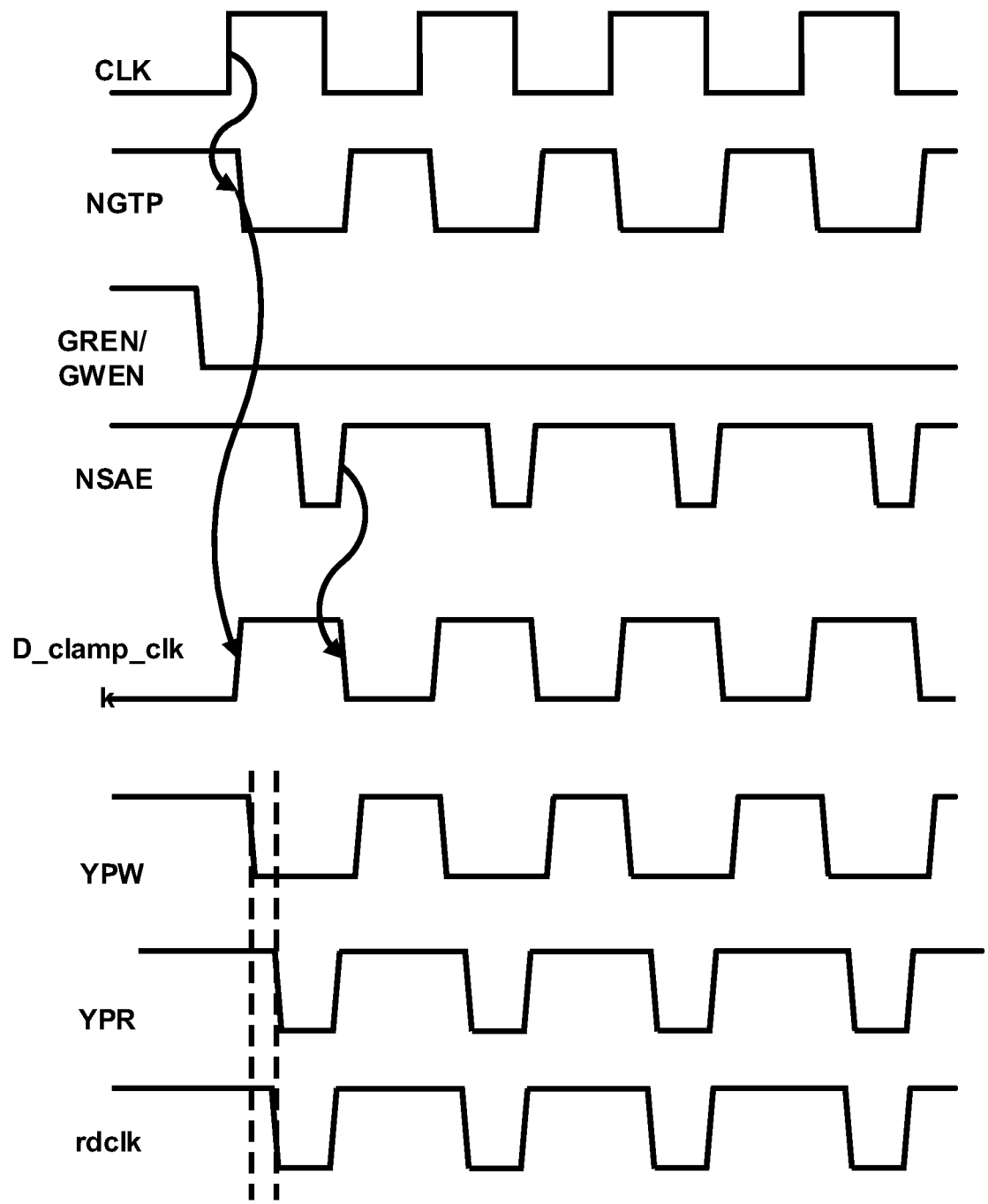
FIG. 6 illustrates a waveform diagram associated with memory circuitry in accordance with various implementations described herein.

FIG. 6 illustrates a waveform diagram 600 associated with memory circuitry in accordance with various implementations described herein. In some instances, the waveform diagram 600 may refer to a waveform with ypr delay 602.

As shown in FIG. 6, a rising edge of a clock signal (CLK) may trigger a falling edge of the complementary global timing pulse (NGTP) during deactivation (i.e., low logic state) of the global write enable signal and the global read enable (GREN/GREN) signal and during activation (i.e., high logic state) of the complementary sense amplifier enable signal (NSAE). Also, the rising edge of the CLK signal may trigger a rising edge of the data clamping clock signal (D_clamp_clk), and the rising edge of the NSAE signal may be used to trigger a falling edge of the D_clamp_clk signal. In some instances, as shown, the rising edge of the D_clamp_clk signal triggers a falling edge of the YPW, YPR, read clock (rdclk) signals, wherein the falling edge of the YPW signal occurs before the falling edge of the YPR and rdclk signals. As such, the falling edge of the YPR and rdclk signals are delayed by a period of time after the falling edge of the YPW signal.

In some implementations, the various memory access schemes and techniques described herein provide for performing a read operation inside a write window of a write operation, which may be used to remove the effects of bitline coupling during read-write memory access operations. As shown in FIG. 6, the various memory access schemes and techniques described herein provide for delayed precharge and no delay in YPR, which helps achieve removing bitline coupling during read-write operations.

FIGS. 7-10B illustrates process diagrams of various methods for performing memory access operations in accordance with implementations described herein.

It should be understood that even though the methods of FIGS. 7-10B may indicate a particular order of operation execution, in some cases, portions of operations may be executed in a different order, and on different systems. In other cases, additional operations and/or steps may be added to and/or omitted from methods of FIGS. 7-10B. Also, the methods of FIGS. 7-10B may be implemented in hardware and/or software. If implemented in hardware, methods of FIGS. 7-10B may be implemented with various components and/or circuitry, as described herein in FIGS. 1-6. Also, if implemented in software, the methods of FIGS. 7-10B may be implemented as various programs and/or software instruction processes that are configured for the various column multiplexing schemes and techniques, as described herein. In addition, if implemented in software, various instructions related to implementing the methods of FIGS. 7-10B may be stored in memory and/or a database. Also, in other instances, a computer or various other types of computing devices (e.g., as described herein below in FIG. 12) having at least one processor and memory may be configured to perform methods of FIGS. 7-10B.

Figure 7:
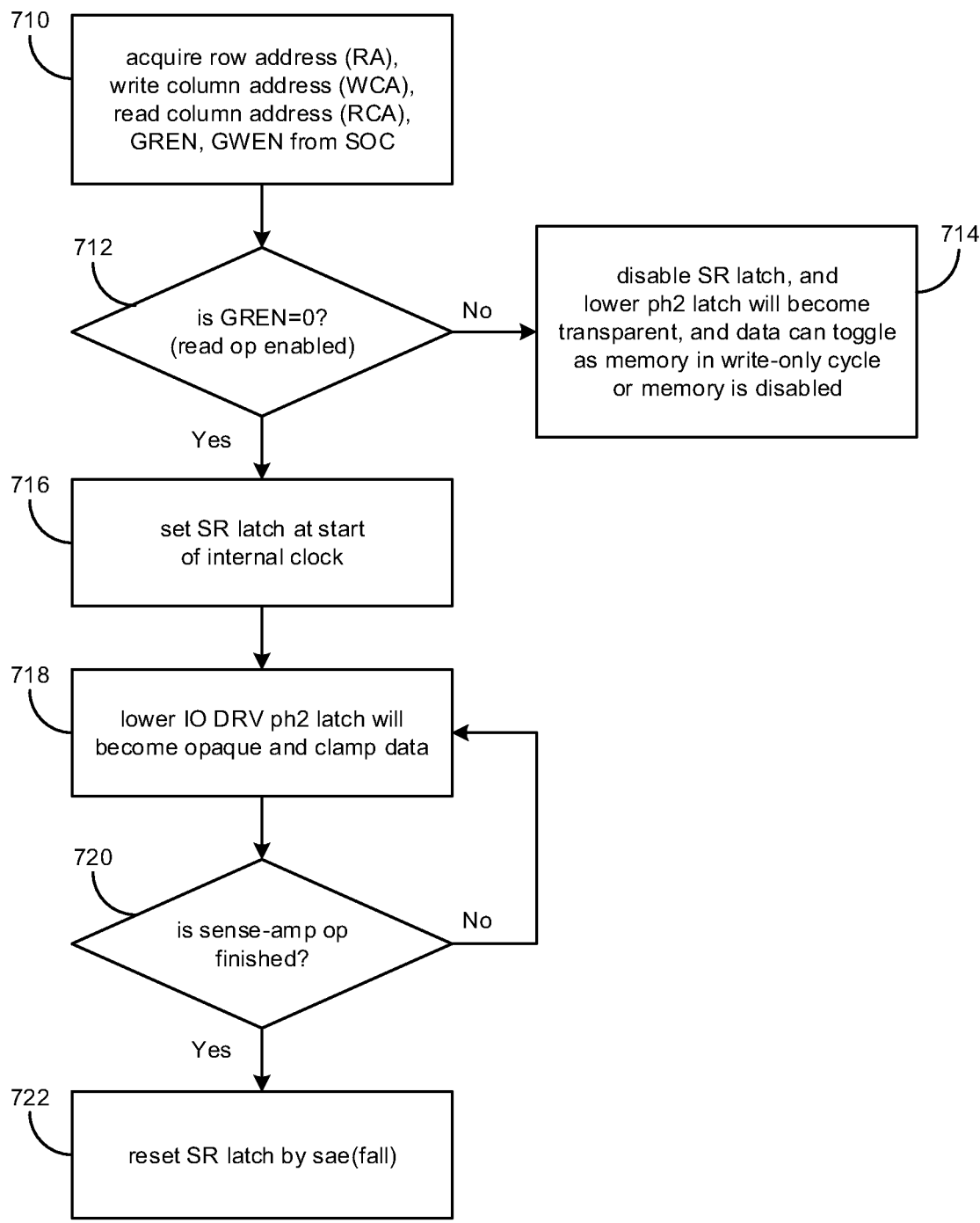
FIGS. 7-10B illustrates process diagrams of various methods for performing memory access operations in accordance with implementations described herein.

As shown in FIG. 7, method 700 may refer to a method to avoid data-to-bitline coupling 702. In block 710, method 700 may acquire a row address (RA), a write column address (WCA), a read column address (RCA), a global write enable signal (GREN), and a global read enable signal (GREN) from logic circuitry, such as, e.g., a system-on-a-chip (SoC). In decision block 712, method 700 may determine whether the GREN signal refers to a logic zero (0) state, which may indicate a read operation enabled state. If no, then in block 714, method 700 may disable the SR latch, and the lower ph2 latch will become transparent, and then data can toggle as memory in a write-only mode cycle or memory is disabled. Otherwise, if yes, then in block 716, method 700 may set the SR latch at start of the internal clock. In block 718, method 700 may clamp the data signal, wherein the lower IO DRV ph2 latch will become opaque and clamp the data. In decision block 720, method 700 may determine whether the sense amplifier operation is finished. If no, then method 700 may return to block 718. Otherwise, if yes, then in block 722, method 700 may reset the SR latch by the falling edge of the sense amplifier enable signal (sae).

Figure 8A:
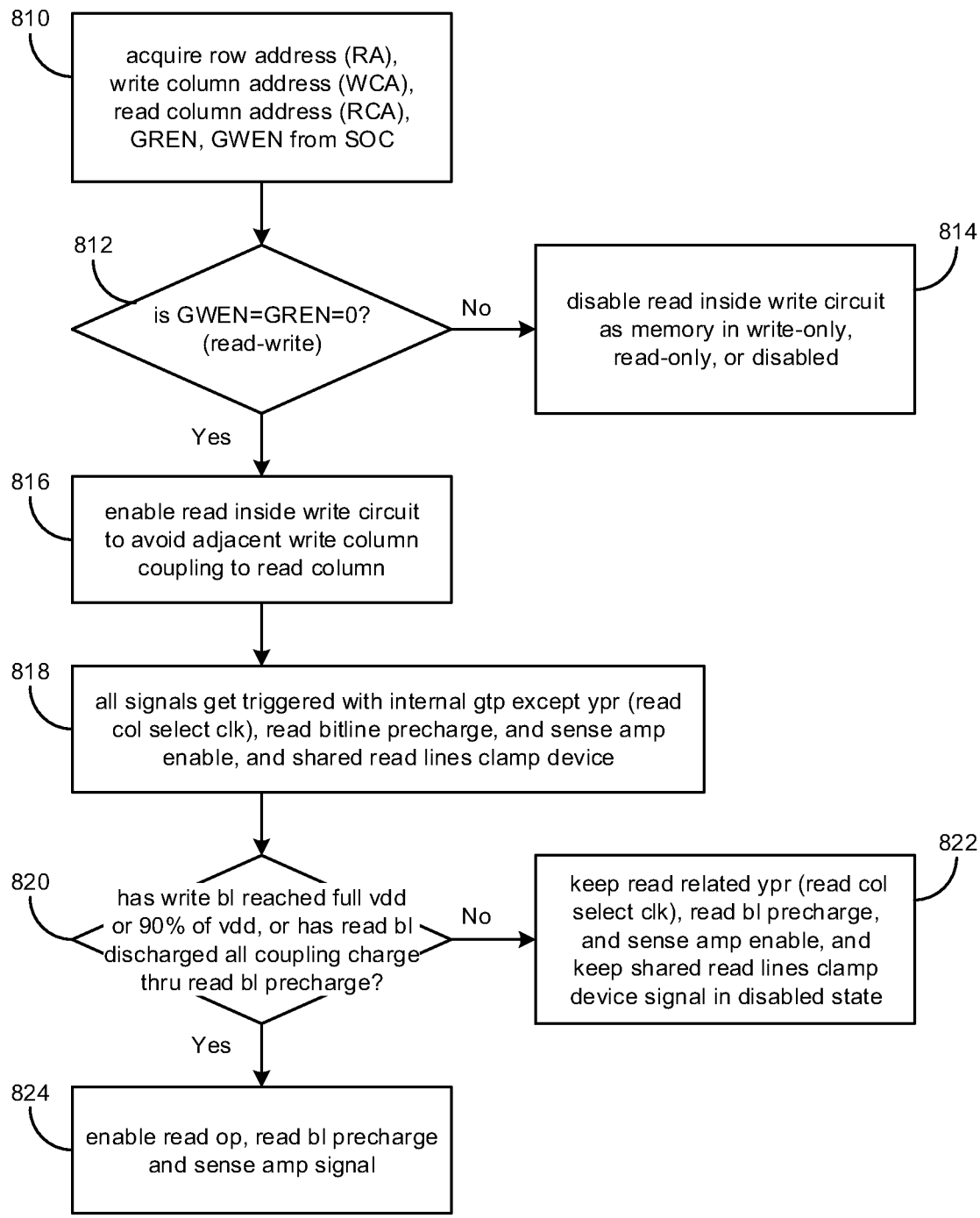

As shown in FIG. 8A, method 800A may refer to a method to perform a read operation inside a write operation with read bitline precharge 802A. In block 810, method 800A may acquire a row address (RA), a write column address (WCA), a read column address (RCA), a global write enable signal (GREN), and a global read enable signal (GREN) from logic circuitry, such as, e.g., an SoC. In decision block 812, method 800A may determine whether the GWEN signal and the GREN signal refer to a logic zero (0) state, which may indicate a read-write (RW) operation enabled state. If no, then in block 814, method 800A may disable the read inside write circuit as either in a write-only mode, a read-only mode, or a disabled mode. Otherwise, if yes, then in block 816, method 800A may enable the read inside write circuit to avoid adjacent write column coupling to read column. In block 818, method 800A may trigger one or more or all signals with the internal global timing pulse (gtp), except for the ypr signal (i.e., read column select clock), the read bitline precharge, the sae signal, and the shared read lines clamp device. In decision block 820, method 800A may determine whether the write bitline has reached full Vdd or 90% of Vdd, or determine whether the read bitline has discharged some or all coupling charge through the read bitline precharge. If no, then in block 822, method 800A may keep the read related ypr signal (read column select clock), the read bitline precharge, and the sae signal. Also, in block 822, method may keep the shared read lines claims device signal in a disabled state. Otherwise, if yes, then in block 824, method 800A may enable the read operation, read bitline precharge, and the sae signal.

Figure 8B:
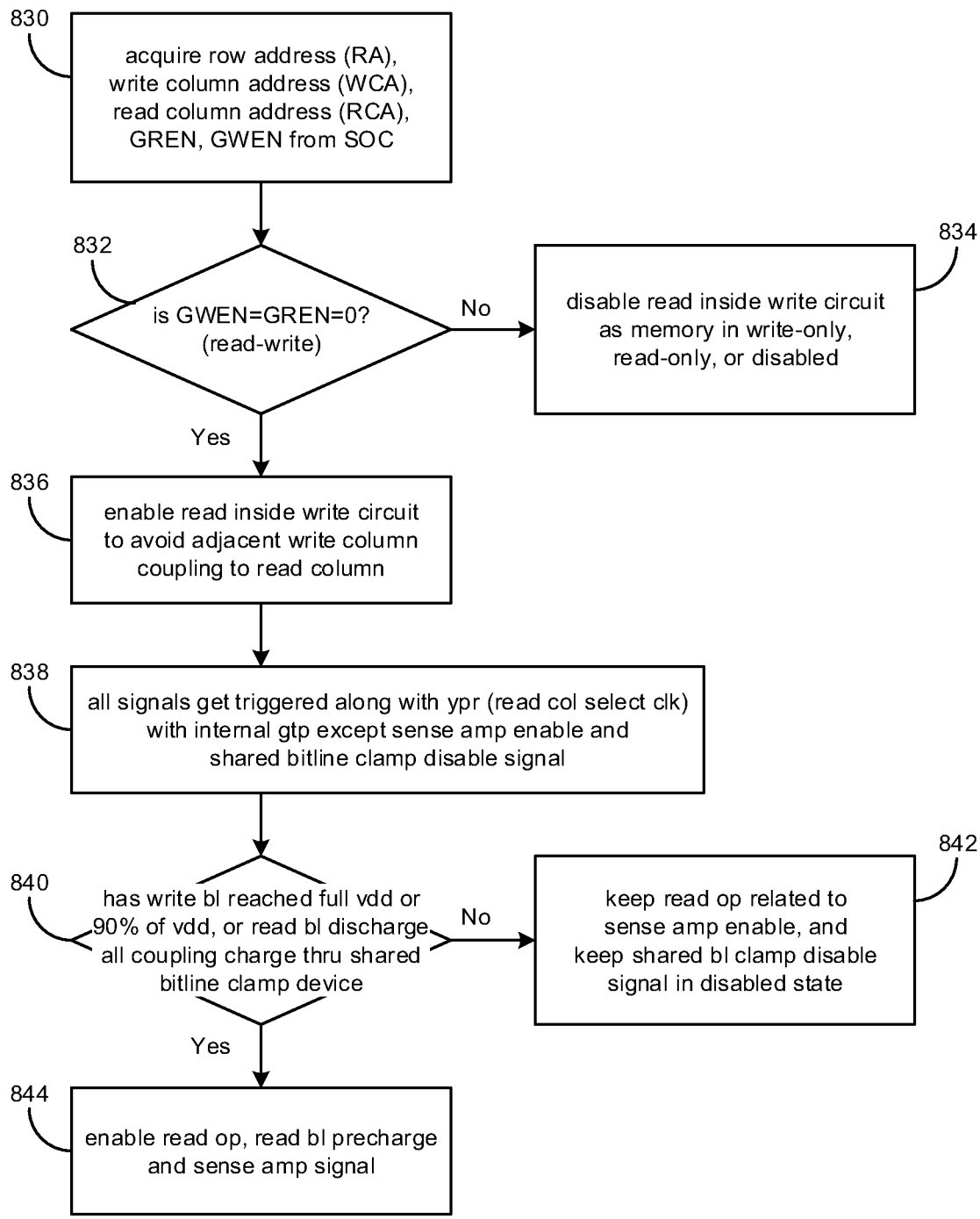

As shown in FIG. 8B, method 800B may refer to a method to perform a read operation inside a write operation with shared read line clamping device 802A. In block 830, method 800B may acquire a row address (RA), a write column address (WCA), a read column address (RCA), a global write enable signal (GREN), and a global read enable signal (GREN) from logic circuitry, such as, e.g., an SoC. In decision block 832, method 800A may determine whether the GWEN signal and the GREN signal refer to a logic zero (0) state, which may indicate a read-write (RW) operation enabled state. If no, then in block 834, method 800B may disable the read inside write circuit as either in a write-only mode, a read-only mode, or a disabled mode. Otherwise, if yes, then in block 836, method 800B may enable the read inside write circuit to avoid adjacent write column coupling to read column. In block 838, method 800B may trigger one or more or all signals (along with the ypr signal) with the internal global timing pulse (gtp), except for the sae signal and the shared bitline clamp disable device. In decision block 840, method 800B may determine whether the write bitline has reached full Vdd or 90% of Vdd, or determine whether the read bitline has discharged some or all coupling charge through the shared bitline clamping device. If no, then in block 842, method 800B may keep the read operation related to the sae signal, and keep the shared bitline clamp disable signal in the disabled state. Otherwise, if yes, then in block 844, method 800B may enable the read operation, read bitline precharge, and the sae signal.

Figure 9A:
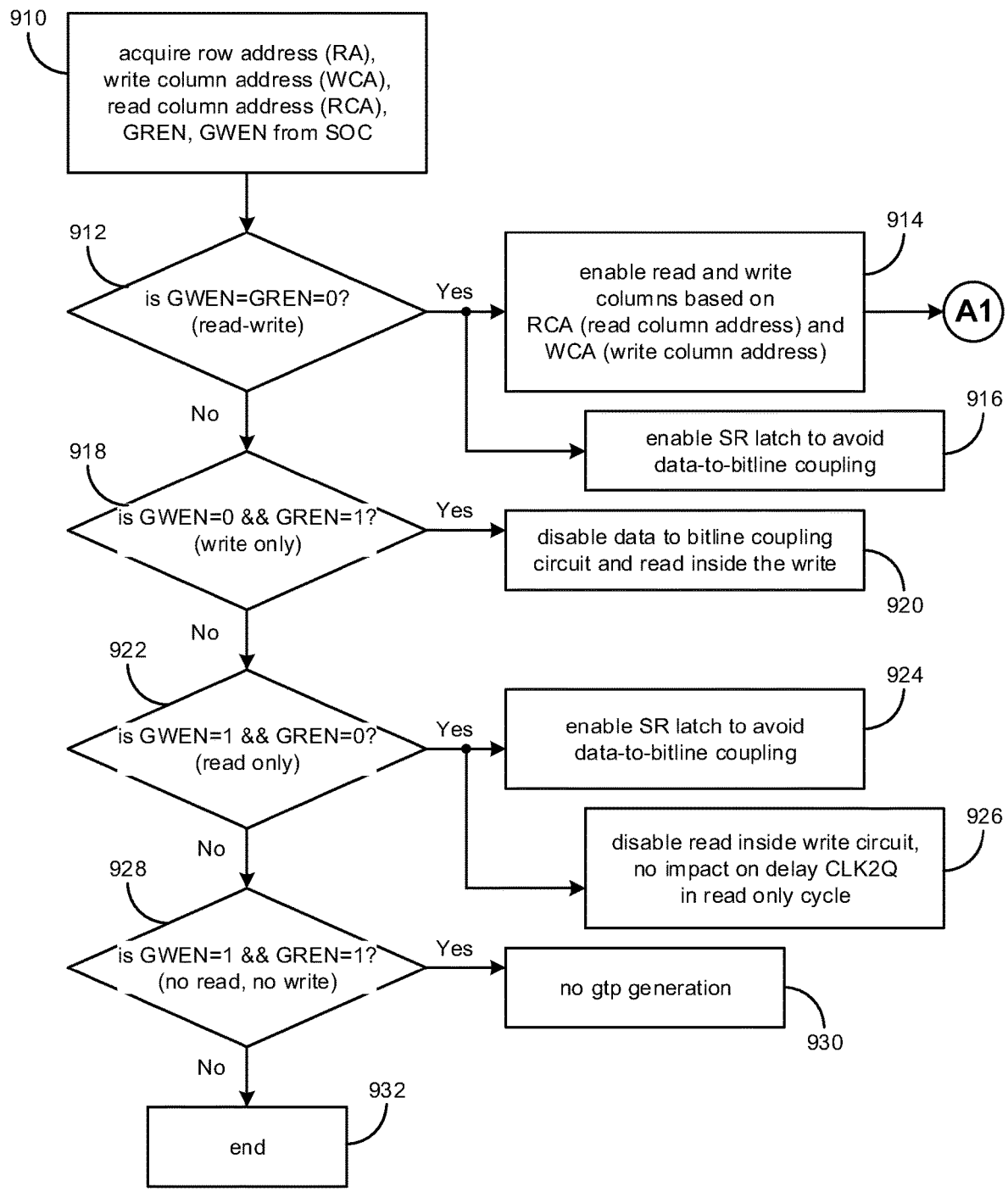

As shown in FIG. 9A, method 900 may refer to a method to perform a dual y-mux operation with no read bypass pin 902. In block 910, method 900 may acquire a row address (RA), a write column address (WCA), a read column address (RCA), a global write enable signal (GREN), and a global read enable signal (GREN) from logic circuitry, such as, e.g., an SoC. In decision block 912, method 900 may determine whether the GWEN signal and the GREN signal refer to a logic zero (0) state, which may indicate a read-write (RW) operation enabled state. If yes, in block 914, method 900 may enable read and write columns based on the RCA and the WCA and proceed to decision block 930 via encircled element A1. Also, if yes, in block 916, method 900 may enable the SR latch to avoid data-to-bitline coupling. Otherwise, if no, then in decision block 918, method 900 may determine whether the GWEN signal refers to a logic zero (0) state and the GREN signal refers to a logic one (1) state, which may indicate a write-only operation enabled state. If yes, then in block 920, method 900 may disable the data-to-bitline coupling circuit and also disable the read inside write operation. Otherwise, if no, then in decision block 922, method 900 may determine whether the GWEN signal refers to a logic one (1) state and the GREN signal refers to a logic zero (0) state, which may indicate a read-only operation enabled state. If yes, then in block 924, method 900 may enable the SR latch to avoid data-to-bitline coupling. Also, if yes, then in block 926, method 900 may disable the read inside write circuit, and there may be no impact of delay CLK2Q in the read-only cycle. Otherwise, if no, then in decision block 928, method 900 may determine whether the GWEN signal refers to a logic one (1) state and the GREN signal refers to a logic one (1) state, which may indicate a no-read and no-write operation enabled state. If yes, then in block 930, method 900 may not generate the gtp signal. If no, then in block 932, method 900 may terminate in an end state.

Figure 9B:
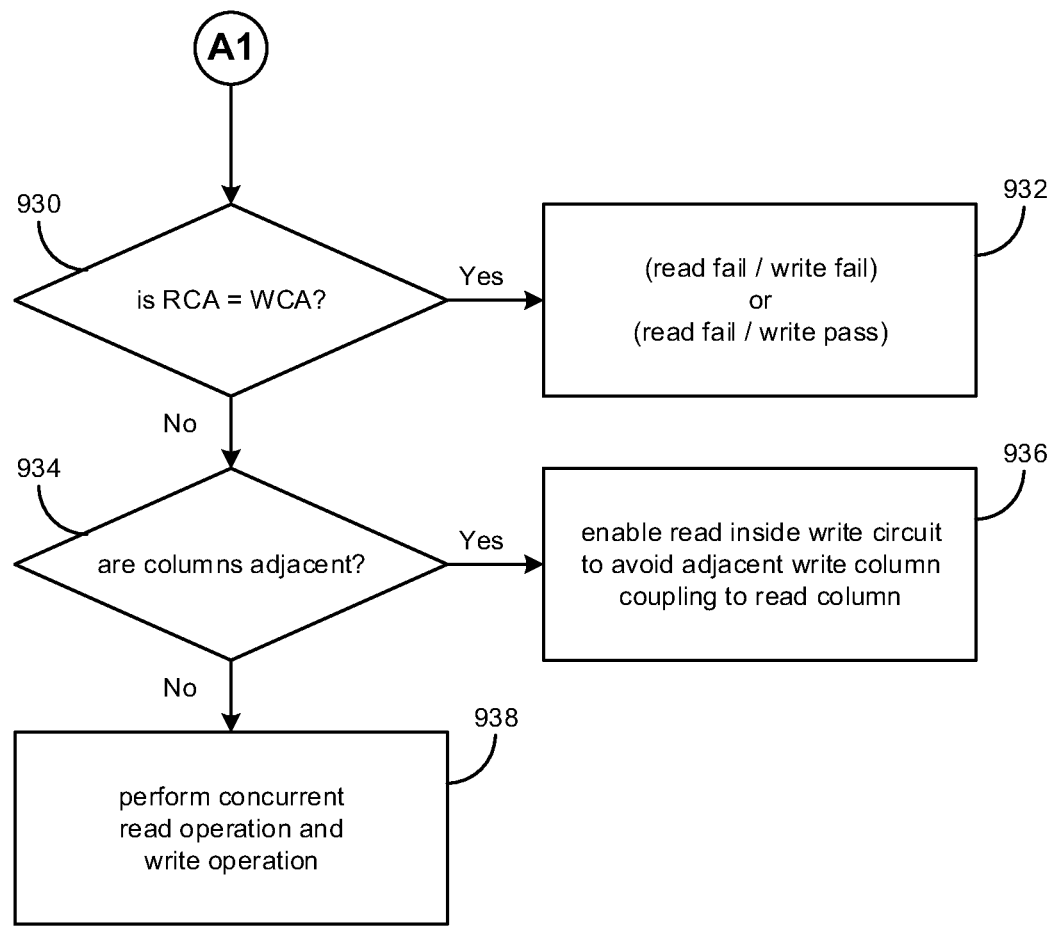

As shown in FIG. 9B, method 900 may refer to a continuation of the method to perform dual y-mux operation with no read bypass pin 902. From block 914 in FIG. 9A, method 900 may proceed to decision block 930 via encircled element A1. In decision block 930, method 900 may determine whether RCA is equal to WCA. If yes, then in block 932, method 900 may provide for an operational state of read fail/write fail or read fail/write pass. Otherwise, if no, then in decision block 934, method 900 may determine whether the read and write columns are adjacent. If yes, then in block 936, method 900 may enable the read inside write circuit to avoid adjacent write column coupling to the read column. If no, then in block 938, method 900 may perform concurrent read and write operations. In some implementations, the condition for adjacent columns in block 936 may refer to the situation where RCA=WCA+1 in combination with WCA=RCA+1, WCA-=RCA-1, and RCA=WCA-1.

Figure 10A:
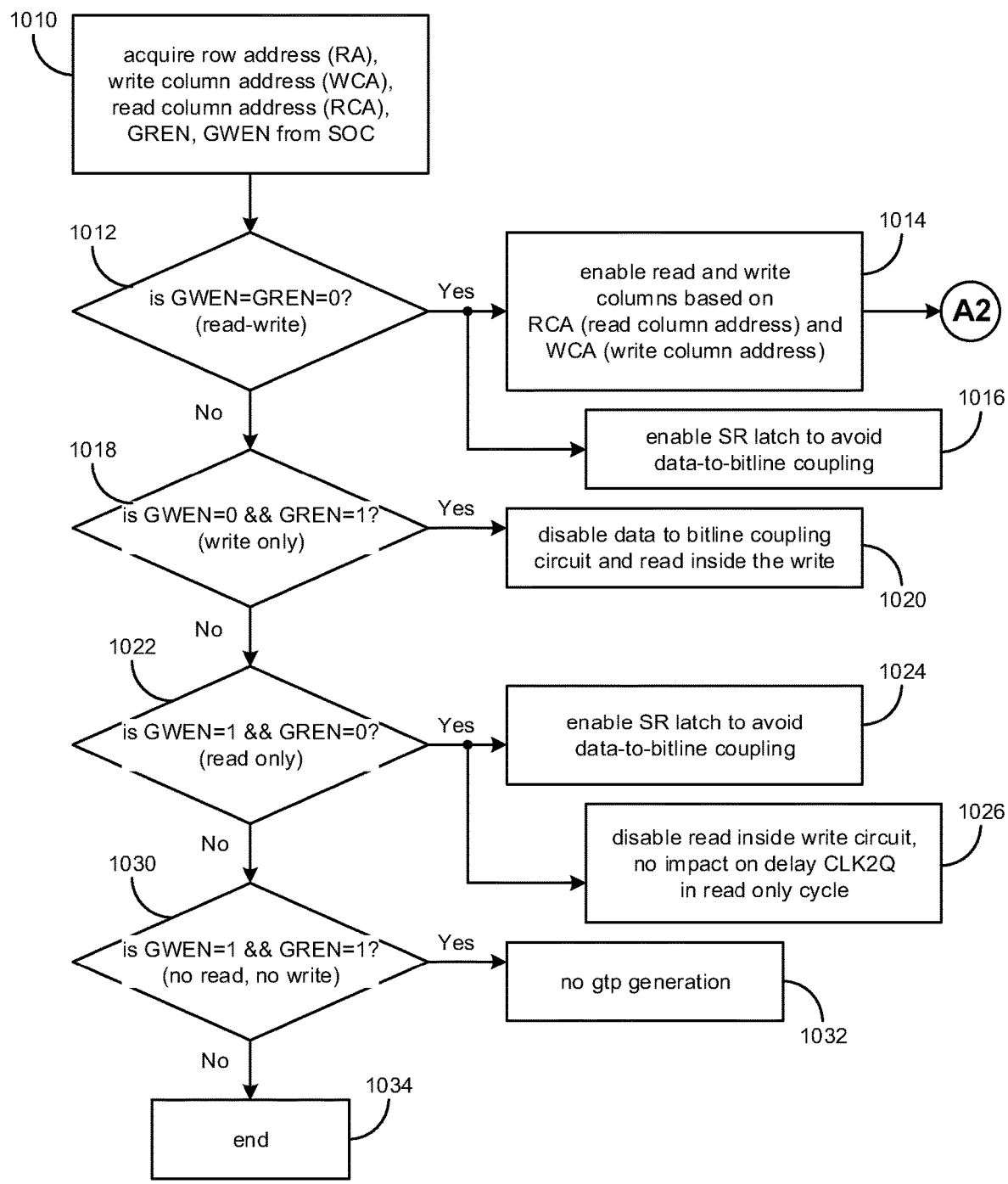

As shown in FIG. 10A, method 1000 may refer to a method to perform a dual y-mux operation with read bypass pin 1002. In block 1010, method 1000 may acquire a row address (RA), a write column address (WCA), a read column address (RCA), a global write enable signal (GREN), and a global read enable signal (GREN) from logic circuitry, such as, e.g., an SoC. In decision block 1012, method 1000 may determine whether the GWEN signal and the GREN signal refer to a logic zero (0) state, which may indicate a read-write (RW) operation enabled state. If yes, in block 1014, method 1000 may enable read and write columns based on the RCA and the WCA and proceed to decision block 1030 via encircled element A2. Also, if yes, in block 1016, method 1000 may enable the SR latch to avoid data-to-bitline coupling. Otherwise, if no, then in decision block 1018, method 1000 may determine whether the GWEN signal refers to a logic zero (0) state and the GREN signal refers to a logic one (1) state, which may indicate a write-only operation enabled state. If yes, then in block 1020, method 1000 may disable the data-to-bitline coupling circuit and also disable the read inside write operation. Otherwise, if no, then in decision block 1022, method 1000 may determine whether the GWEN signal refers to a logic one (1) state and the GREN signal refers to a logic zero (0) state, which may indicate a read-only operation enabled state. If yes, then in block 1024, method 1000 may enable the SR latch to avoid data-to-bitline coupling. Also, if yes, then in block 1026, method 1000 may disable the read inside write circuit, and there may be no impact of delay CLK2Q in the read-only cycle. Otherwise, if no, then in decision block 1028, method 1000 may determine whether the GWEN signal refers to a logic one (1) state and the GREN signal refers to a logic one (1) state, which may indicate a no-read and no-write operation enabled state. If yes, then in block 1030, method 1000 may not generate the gtp signal. If no, then in block 1032, method 1000 may terminate in an end state.

Figure 10B:
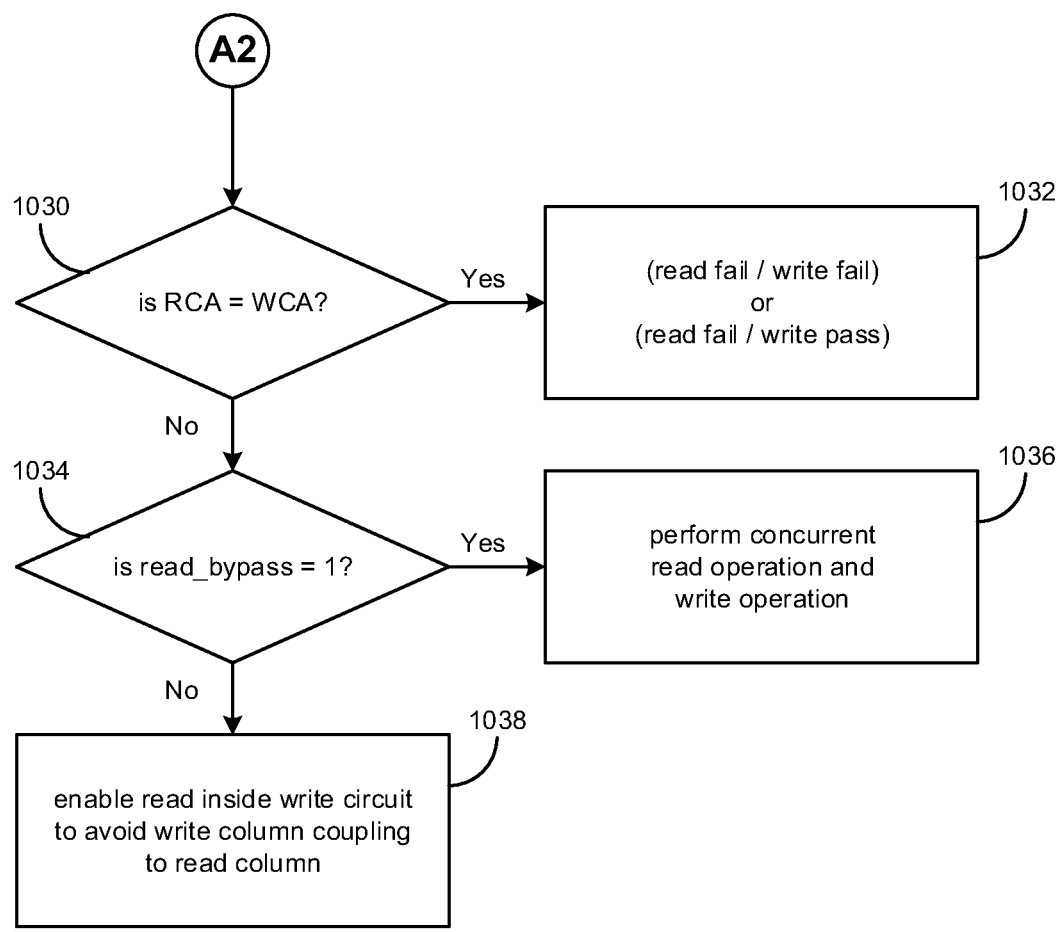

As shown in FIG. 10B, method 1000 may refer to a continuation of the method to perform dual y-mux operation with read bypass pin 1002. From block 1014 in FIG. 10A, method 1000 may proceed to decision block 1030 via encircled element A2. In decision block 1030, method 1000 may determine whether RCA is equal to WCA. If yes, then in block 1032, method 1000 may provide for an operational state of read fail/write fail or read fail/write pass. Otherwise, if no, then in decision block 1034, method 1000 may determine whether the read_bypass is in a logic one (1) state. If yes, then in block 1036, method 1000 may perform concurrent read and write operations. If no, then in block 1038, method 1000 may enable the read inside write circuit to avoid adjacent write column coupling to the read column.

Figure 11:
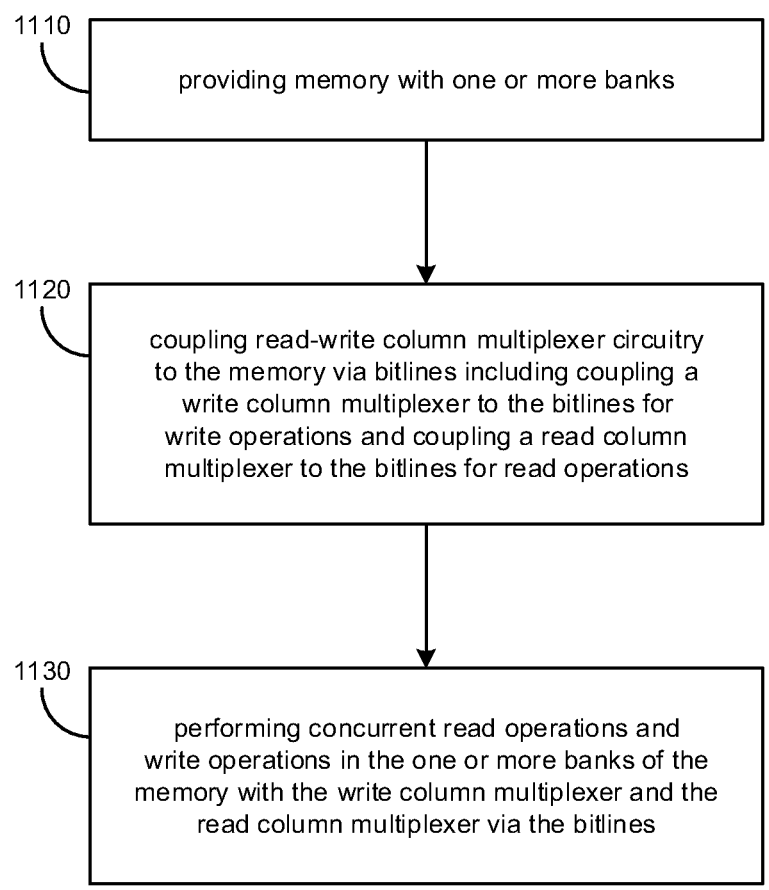
FIG. 11 illustrates a process diagram of a method for performing concurrent memory access operations in accordance with implementations described herein.

FIG. 11 illustrates a diagram of a method 1100 for concurrent memory access operations in accordance with implementations described herein.

It should be understood that even though method 1100 may indicate a particular order of operation execution, in some cases, portions of the operations may be executed in a different order, and on different systems. In other cases, additional operations and/or steps may be added to and/or omitted from method 1100 Also, method 1100 may be implemented in hardware and/or software. If implemented in hardware, method 1100 may be implemented with various components and/or circuitry, as described herein in FIGS. 1-10. Also, if implemented in software, method 1100 may be implemented as various programs and/or software instruction processes that are configured for the various column multiplexing schemes and techniques, as described herein. In addition, if implemented in software, various instructions related to implementing method 1100 may be stored in memory and/or a database. Also, in other instances, a computer or various other types of computing devices (e.g., as described herein below in FIG. 12) having at least one processor and memory may be configured to perform method 1100.

As shown in reference to FIG. 11, in block 1110, method 1100 may provide memory with one or more banks. In block 1120, method 1100 may couple read-write column multiplexer circuitry to the memory via bitlines including coupling a write column multiplexer to the bitlines for write operations and coupling a read column multiplexer to the bitlines for read operations. In some implementations, the memory may include single port memory, and the read-write column multiplexer circuitry may include dual column multiplexer circuitry (e.g., dual Y-mux circuitry).

In block 1130, method 1100 may perform concurrent read operations and write operations in the one or more banks of the memory with the write column multiplexer and the read column multiplexer via the bitlines. In some instances, performing concurrent read operations and write operations includes performing the write operation slower than the read operation, and the read operation is performed within a timing window interval of the write operation that involves removing coupling between bitlines that are used while performing the write operation and the read operation. In some instances, a global write enable signal (GWEN) along with a write column multiplexer address (WCA) may be used to perform the write operation in the first bank or the second bank, and also, a global read enable signal (GREN) along with a read column multiplexer address (RCA) may be used to perform the read operation in the first bank or the second bank.

In some implementations, the one or more banks may include multiple different banks, and performing concurrent read operations and write operations in the multiple different banks may be achieved with the same column. In some instances, performing concurrent read operations and write operations in the multiple different banks is achieved with different columns. In other instances, performing concurrent read operations and write operations in the one or more banks may be achieved in the same bank with different columns. Also, the write column multiplexer refers to a dedicated write column multiplexer coupled to the bitlines for performing various write operations controlled by a write column multiplexer address (WCA), and the read column multiplexer refers to a dedicated read column multiplexer coupled to the bitlines for performing read operations controlled by a read column multiplexer address (RCA).

In some implementations, method 1100 may include precharging the bitlines with a precharge transistor that is activated with a delayed read clock, and during bitline precharge, a read activation signal is provided to the second multiplexer so that the read operation is performed without delay. In some instances, the first bank may have an array of bitcells arranged in columns and rows, and the second bank may have another array of bitcells arranged in columns and rows. The memory may refer to static random access memory (SRAM) or magneto-resistive RAM (MRAM), and also, the bitcells may refer to SRAM bitcells or MRAM bitcells.

Figure 12:
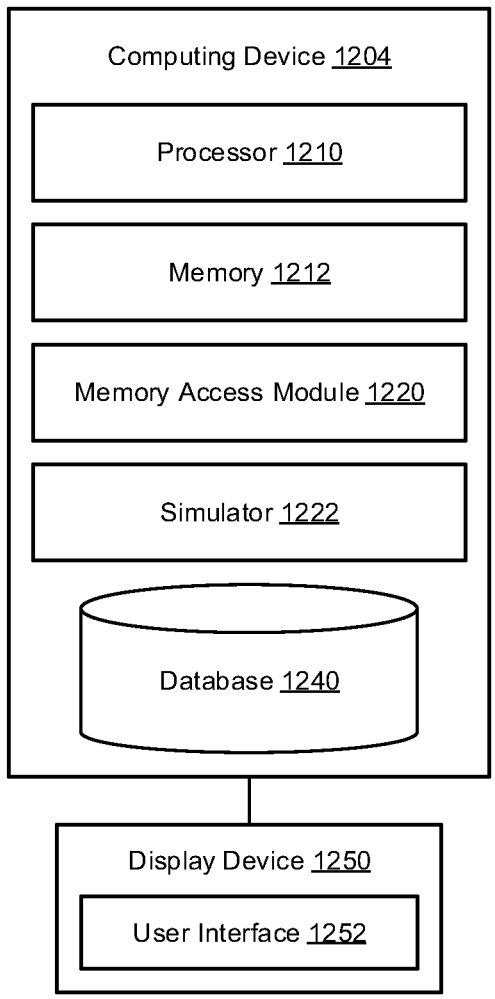
FIG. 12 illustrates a diagram of a computer system for providing column multiplexing schemes and techniques in physical layout design in accordance with various implementations described herein.

FIG. 12 illustrates a diagram of a computer system 1200 for providing column multiplexing schemes and techniques in physical layout design in accordance with various implementations described herein.

In reference to FIG. 12, the system 1200 may be associated with at least one computing device 1204 that is implemented as a special purpose machine configured for implementing column multiplexing techniques in physical design. In some instances, the computing device 1204 may include standard element(s) and/or component(s), including processor 1210, memory 1212 (e.g., non-transitory computer-readable storage medium), one or more database(s) 1240, power, peripherals, and various other computing elements and/or components that may not be specifically shown in FIG. 12. Also, the computing device 1204 may include instructions recorded or stored on the non-transitory computer-readable medium 1212 that are executable by the processor 1210. The computing device 1204 may be associated with a display device 1250 (e.g., a monitor or other display) that may be used to provide a user interface (UI) 1252, such as, e.g., a graphical user interface (GUI). In some instances, the UI or GUI 1252 may be configured to receive parameters and/or preferences from a user for managing, operating, and/or controlling the computing device 1204. Thus, the computing device 1204 may include the display device 1250 for providing output to a user, and also, the display device 1250 may include the UI 1252 for receiving input from the user.

In reference to FIG. 12, the computing device 1204 may have a memory access module 1220 that may be configured to cause the processor 1210 to implement schemes and techniques described herein in reference to FIGS. 1-11, including various column multiplexing schemes and techniques related to implementing integrated circuitry in physical layout design. Also, the memory access module 1220 may be implemented in hardware and/or software. In some instances, if implemented in software, the memory access module 1220 is stored in memory 1212 or database 1240. In some instances, if implemented in hardware, the memory access module 1220 may refer to a separate processing component that is configured to interface with the processor 1210.

The memory access module 1220 may be configured to cause the processor 1210 to perform various operations, as provided herein in reference to the column multiplexing schemes and techniques described in FIGS. 1-11. In this instance, the memory 1212 has stored thereon instructions that, when executed by the processor 1210, cause the processor 1210 to perform one or more of the following operations.

For instance, the memory access module 1220 may be configured to cause the processor 1210 to access memory having one or more banks. Also, in some instances, the memory access module 1220 may be configured to cause the processor 1210 to couple column multiplexer circuitry to the memory with bitlines including coupling a write column multiplexer to the bitlines for write operations and coupling a read column multiplexer to the bitlines for read operations. In addition, in some instances, the memory access module 1220 may be configured to cause the processor 1210 to perform concurrent read-write access operations in the one or more banks of the memory with the write column multiplexer and the read column multiplexer via the bitlines.

In some implementations, the one or more banks may include multiple different banks, and performing concurrent read-write access operations may include performing concurrent read operations and write operations in the multiple different banks with the same column. In some instances, performing concurrent read-write access operations may include performing concurrent read operations and write operations in the multiple different banks with different columns. In other instances, performing concurrent read-write access operations may include performing concurrent read operations and write operations in the one or more banks in the same bank with different columns.

In accordance with various implementations described herein in reference to FIGS. 1-11, any one or more or all of these operations performed by the memory access module 1220 may be altered, modified, changed and/or updated so as to thereby provide various specific embodiments as shown in FIGS. 1-11. Also, in some instances, each of the circuit components may be in a form of a physical structure having various shapes with length, width and/or various other spatial definitions, and the physical structure may be associated with an integrated circuit that is included in a place and route environment for DRC and various rules associated therewith.

Further, in reference to FIG. 12, the computing device 1204 may include a simulator 1222 that is configured to cause the processor 1210 to generate one or more simulations of the circuit layout and related components. The simulator 1222 may be referred to as a simulating component or module that may be implemented in hardware or software. If implemented in software, the simulator 1222 may be stored in the memory 1212 or the database 1240. If implemented in hardware, the simulator 1220 may be a separate processing component configured to interface with the processor 1210. In some instances, the simulator 1222 refers to a SPICE simulator that is configured to generate SPICE simulations of the cell layout and related components. SPICE refers to an acronym for Simulation Program with Integrated Circuit Emphasis, which is an open source analog electronic circuit simulator. Also, SPICE may refer to a general-purpose software program used by the semiconductor industry to check the integrity of physical structure designs and to predict behavior of physical structure designs. Thus, the memory access module 1220 may be configured to interface with the simulator 1222 so as to generate various timing data based on one or more simulations (including, e.g., SPICE simulations) of the physical circuit layout and related components that are used for analyzing performance characteristics of the integrated circuit including timing data of the physical circuit layout and related components. Also, the memory access module 1220 may be configured to use the one or more simulations (including, e.g., SPICE simulations) of the circuit layout and related components for evaluating operating behavior and conditions thereof.

In some implementations, the computing device 1204 may include one or more databases 1240 configured to store and/or record various data and information related to implementing column multiplexing techniques in physical design. The database(s) 1240 may be configured to store data and information related to integrated circuitry, operating conditions, operating behavior and/or timing data of the circuit layout design and related components. Also, the database(s) 1240 may be configured to store data and information related to the circuit layout and related components and timing data in reference to simulation data (including, e.g., SPICE simulation data).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method. The method may include providing memory with one or more banks. The method may include coupling read-write column multiplexer circuitry to the memory via bitlines including coupling a write column multiplexer to the bitlines for write operations and coupling a read column multiplexer to the bitlines for read operations. The method may include performing concurrent read operations and write operations in the one or more banks of the memory with the write column multiplexer and the read column multiplexer via the bitlines.

Described herein are various implementations of a device. The device may include memory architecture having one or more bitcell arrays. The device may include column multiplexer circuitry coupled to the memory architecture via multiple bitlines including a write column multiplexer coupled to the bitlines for write access operations and a read column multiplexer coupled to the bitlines for read access operations. The device may include logic circuitry that performs concurrent or single memory access operations in the one or more bitcell arrays of the memory architecture with the write column multiplexer and the read column multiplexer via the bitlines. The device may include timing circuitry having one or more latches that are arranged to avoid data-to-bitline coupling between the bitlines while performing the concurrent or single memory access operations in the one or more bitcell arrays of the memory architecture.

Described herein are various implementations of a system. The system may include a processor and memory having stored thereon instructions that, when executed by the processor, cause the processor to access memory having one or more banks. The instructions may cause the processor to couple column multiplexer circuitry to the memory with bitlines including coupling a write column multiplexer to the bitlines for write operations and coupling a read column multiplexer to the bitlines for read operations. The instructions may cause the processor to perform concurrent read-write access operations in the one or more banks of the memory with the write column multiplexer and the read column multiplexer via the bitlines.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
providing memory with one or more banks;
coupling read-write column multiplexer circuitry to the memory via bitlines including coupling one or more write column multiplexers to a write driver via one or more first shared bitlines for write operations and coupling two or more read column multiplexers to a sense amplifier via one or more second shared bitlines for read operations; and
performing concurrent read operations and write operations in the one or more banks of the memory with the one or more write column multiplexers and the two or more read column multiplexers via the one or more first shared bitlines and the one or more second shared bitlines.

2. The method of claim 1, wherein the one or more banks comprise a plurality of different banks, and wherein performing the concurrent read operations and write operations in the plurality of different banks is achieved with the same column.

3. The method of claim 1, wherein the one or more banks comprise a plurality of different banks, and wherein performing the concurrent read operations and write operations in the plurality of different banks is achieved with different columns.

4. The method of claim 1, wherein performing the concurrent read operations and write operations in the one or more banks is achieved in the same bank with different columns.

5. The method of claim 1, wherein the memory comprises single port memory, and wherein the read-write column multiplexer circuitry comprises dual column multiplexer circuitry (dual Y-mux circuitry).

6. The method of claim 1, wherein:
the one or more write column multiplexers refer to dedicated write column multiplexers coupled to the bitlines for performing the write operations controlled by a write column multiplexer address (WCA), and
the two or more read column multiplexers refer to dedicated read column multiplexers coupled to the bitlines for performing the read operations controlled by a read column multiplexer address (RCA).

7. The method of claim 1, wherein:
performing the concurrent read operations and write operations in the memory includes performing the write operations slower than the read operations.

8. The method of claim 1, wherein:
the one or more banks include a first bank and a second bank,
a global write enable signal (GWEN) along with a write column multiplexer address (WCA) is used to perform the write operations in the first bank or the second bank, and
a global read enable signal (GREN) along with a read column multiplexer address (RCA) is used to perform the read operations in the first bank or the second bank.

9. The method of claim 1, wherein:
the one or more banks include a first bank and a second bank,
the first bank has an array of bitcells arranged in columns and rows,
the second bank has another array of bitcells arranged in columns and rows,
the memory refers to static random access memory (SRAM) or magneto-resistive RAM (MRAM), and
the bitcells refer to SRAM bitcells or MRAM bitcells.

10. The method of claim 1, wherein:
each bitcell array has a plurality of bitcells arranged in columns coupled together with the bitlines,
the bitlines have a first set of bitlines and a second set of bitlines complementary to the first set of bitlines, and
each bitcell in each bitcell array is coupled to the first set of bitlines and the second set of bitlines.

11. A device, comprising:
memory architecture having a plurality of bitcell arrays;
column multiplexer circuitry coupled to the memory architecture via a plurality of bitlines including one or more write column multiplexers coupled to a write driver via one or more first the shared bitlines for write operations and two or more-a plurality of read column multiplexers coupled to a sense amplifier via one or more second shared bitlines for read operations;
logic circuitry that performs concurrent memory access operations in the plurality of bitcell arrays of the memory architecture with the one or more write column multiplexers and the two or more read column multiplexers via the one or more first shared bitlines and the one or more second shared bitlines; and
timing circuitry having one or more latches that are arranged to avoid data-to-bitline coupling between the plurality of bitlines while performing the concurrent memory access operations in the plurality of bitcell arrays of the memory architecture.

12. The device of claim 11, wherein the plurality of bitcell arrays comprises a plurality of different bitcell arrays, and wherein performing the concurrent memory access operations comprises performing concurrent read operations and write operations in the plurality of different bitcell arrays with the same column.

13. The device of claim 11, wherein the plurality of bitcell arrays comprises a plurality of different bitcell arrays, and wherein performing the concurrent memory access operations comprises performing concurrent read operations and write operations in the plurality of different bitcell arrays with different columns.

14. The device of claim 11, wherein performing the concurrent memory access operations comprises performing concurrent read operations and write operations in the plurality of bitcell arrays in the same bank with different columns.

15. The device of claim 11, wherein the memory architecture comprises single port memory structure, and wherein the column multiplexer circuitry comprises dual read-write column multiplexer circuitry (dual Y-mux circuitry).

16. The device of claim 11, wherein:
the one or more write column multiplexers refer to dedicated write column multiplexers coupled to the plurality of bitlines for performing the write operations controlled by a write column multiplexer address (WCA), and
the two or more read column multiplexers refer to dedicated read column multiplexers coupled to the plurality of bitlines for performing the read operations controlled by a read column multiplexer address (RCA).

17. The device of claim 11, wherein:
each bitcell array has a plurality of bitcells arranged in columns coupled together with the plurality of bitlines,
the plurality of bitlines has a first set of bitlines and a second set of bitlines complementary to the first set of bitlines, and
each bitcell in each bitcell array is coupled to the first set of bitlines and the second set of bitlines.

18. A system, comprising:
a processor; and
memory having stored thereon instructions that, when executed by the processor, cause the processor to:
access memory having a plurality of banks;
couple column multiplexer circuitry to the memory with bitlines including coupling one or more write column multiplexers to a write driver via one or more first shared bitlines for write operations and coupling two or more read column multiplexers to a sense amplifier via one or more second shared bitlines for read operations; and
perform concurrent read-write access operations in the plurality of banks of the memory with the one or more write column multiplexers and the two or more read column multiplexers via the one or more first shared bitlines and the one or more second shared bitlines.

19. The system of claim 18, wherein the plurality of banks comprise a plurality of different banks, and wherein performing the concurrent read-write access operations comprises performing concurrent read operations and write operations in the plurality of different banks with the same column.

20. The system of claim 18, wherein the plurality of banks comprises a plurality of different banks, and wherein performing the concurrent read-write access operations comprises performing concurrent read operations and write operations in the plurality of different banks with different columns.

21. The system of claim 18, wherein performing the concurrent read-write access operations comprises performing concurrent read operations and write operations in the plurality of banks in the same bank with different columns.

22. The system of claim 18, wherein:
each bank has a plurality of bitcells arranged in columns coupled together with the bitlines,
the bitlines have a first set of bitlines and a second set of bitlines complementary to the first set of bitlines, and
each bitcell in each bank is coupled to the first set of bitlines and the second set of bitlines.

* * * * *